US008773201B2

(12) United States Patent
Yamamoto et al.

(10) Patent No.: US 8,773,201 B2
(45) Date of Patent: Jul. 8, 2014

(54) AMPLIFYING DEVICE AND WIRELESS TRANSMISSION DEVICE USING THE SAME

(75) Inventors: Takashi Yamamoto, Osaka (JP); Tadashi Araki, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 123 days.

(21) Appl. No.: 13/393,373

(22) PCT Filed: Sep. 8, 2010

(86) PCT No.: PCT/JP2010/065427
§ 371 (c)(1),
(2), (4) Date: Apr. 18, 2012

(87) PCT Pub. No.: WO2011/030794
PCT Pub. Date: Mar. 17, 2011

(65) Prior Publication Data
US 2012/0194271 A1   Aug. 2, 2012

(30) Foreign Application Priority Data

Sep. 10, 2009 (JP) .................................. 2009-209770
Jun. 7, 2010  (JP) .................................. 2010-130087

(51) Int. Cl.
*H03F 1/30* (2006.01)
(52) U.S. Cl.
USPC .......................... 330/149; 330/297; 330/127
(58) Field of Classification Search
USPC .......................................... 330/149, 297, 127
See application file for complete search history.

(56) References Cited

U.S. PATENT DOCUMENTS

| 6,677,820 B2* | 1/2004 | Miyatani ....................... 330/149 |
| 6,925,106 B2* | 8/2005 | Horaguchi et al. ........... 375/146 |
| 7,212,584 B2* | 5/2007 | Hongo et al. .................. 375/297 |
| 7,317,353 B2* | 1/2008 | Hayase .......................... 330/149 |
| 2009/0088093 A1* | 4/2009 | Nentwig .................... 455/114.3 |
| 2011/0136452 A1* | 6/2011 | Pratt et al. .................. 455/127.1 |

FOREIGN PATENT DOCUMENTS

| JP | 3-76431 | 4/1991 |
| JP | 4-16006 | 1/1992 |
| JP | 5-102739 | 4/1993 |
| JP | 7-249947 | 9/1995 |
| JP | 8-213919 | 8/1996 |
| JP | 10-150327 | 6/1998 |
| JP | 2005-322988 | 11/2005 |

OTHER PUBLICATIONS

Lei Ding, "Digital Predistortion of Power Amplifiers for Wireless Applications," School of Electrical and Computer Engineering Georgia Institute of Technology, Mar. 2004, pp. 1-103.

* cited by examiner

*Primary Examiner* — Patricia Nguyen
(74) *Attorney, Agent, or Firm* — Drinker Biddle & Reath LLP

(57) ABSTRACT

An amplifying device 1 of the present invention performs distortion compensation on distortion appearing in input-output characteristics of an amplifier 4 based on an input signal and an output signal of the amplifier 4, and includes a predistorter 23 that obtains the input signal and the output signal and performs distortion compensation of the amplifier; an ACLR calculation unit 25 that detects the distortion level of the distortion of the amplifier 4; and an adjustment unit 26 that adjusts the power of the input signal in accordance with the distortion level.

12 Claims, 11 Drawing Sheets

AMPLIFYING DEVICE AND WIRELESS TRANSMISSION DEVICE USING THE SAME

TECHNICAL FIELD

The present invention relates to an amplifying device to be used, for example, in a wireless transceiver, and relates to a wireless transmission device using the same.

BACKGROUND ART

In general, a high power amplifier having a high efficiency (HPA: High Power Amplifier, hereinafter also simply referred to as amplifier) has a low input-output characteristic linearity. Accordingly, if the power is amplified using such an amplifier, a desired output may not be obtained due to distortion of the input-output characteristics. Therefore, in order to compensate the distortion in the amplifier, a digital predistortion circuit has been proposed. This digital predistortion circuit performs digital signal processing on an input signal to the amplifier, to generate an inverse distortion characteristic, which is an inverted characteristic of the distortion characteristic of the amplifier. Then, distortion compensation processing is performed in which the generated inverse distortion characteristic is added to the input to the amplifier, thereby yielding the desired amplifier output (see Non-Patent Literature 1, for example).

CITATION LIST

Non Patent Literature

[NON PATENT LITERATURE 1]: Thesis by Lei Ding, "Digital predistortion of power amplifiers for wireless application", Georgia institute of Technology, March 2004.

SUMMARY OF THE INVENTION

Problems to be Solved by the Invention

The above-described distortion of input-output characteristics may occur due to distortion caused by a temperature change or aged deterioration of the amplifier as well as the characteristics of the amplifier itself. Such distortion of the input-output characteristics due to the temperature change or aged deterioration appears as a lowered saturation region, an increased high-order distortion or the like of the input-output characteristics. The level of the distortion appears greater than that of the distortion caused by the characteristics and the like of the amplifier itself. When such a large distortion occurs, fluctuation of the power of an output signal relative to an input power becomes great, which may result in difficulty in compensating the distortion even by the digital predistortion circuit. Therefore, a measure for effectively suppressing the distortion that appears in the input-output characteristics of the amplifier has been desired.

The present invention has been made in consideration of the above situations. An object of the present invention is to provide an amplifying device that can suppress, even when a large distortion has occurred in the input-output characteristics of the amplifier due to a temperature change or aged deterioration, the distortion appearing in the input-output characteristics of the amplifier, and a wireless transmission device using the same.

Solution to the Problems (1) An amplifying device of the present invention includes: an amplifier that amplifies a power of an input signal; a distortion level detection unit that detects a distortion level of distortion that appears in input-output characteristics of the amplifier; and an adjustment unit that adjusts the power of the input signal in accordance with the distortion level.

The amplifying device having the above configuration includes the adjustment unit that adjusts the power of the input signal of the amplifier in accordance with the distortion level detected by the distortion level detection unit. Accordingly, even when a large distortion has occurred in the input-output characteristics of the amplifier due to a temperature change or aged deterioration, the power of the input signal can be adjusted in the direction in which the distortion is suppressed in accordance with the distortion level. As a result, the distortion appearing in the input-output characteristics of the amplifier can be suppressed.

Therefore, for example, when the amplifying device includes a digital predistortion circuit that performs distortion compensation of the amplifier, even when a large distortion has occurred in the input-output characteristics of the amplifier due to a temperature change or aged deterioration, the power of the input signal can be adjusted to a level that allows distortion compensation to be performed in accordance with the distortion level. Consequently, it is possible to suppress deterioration of the accuracy of the distortion compensation.

Here, the distortion of the input-output characteristics of the amplifier includes a lowered saturation region as well as a high-order distortion.

(2) Specifically, in a region where the power of the input signal is relatively high, a large distortion tends to appear due to fluctuation or the like of the saturation region. Therefore, preferably, the adjustment unit determines whether the distortion level detected by the distortion level detection unit is greater than a first threshold value predetermined as an upper limit value that is allowable as the distortion level, and when determining that the distortion level is greater than the first threshold value, the adjustment unit performs the adjustment so as to decrease the power of the input signal.

Accordingly, when the distortion level is greater than the first threshold value, the adjustment unit performs adjustment so as to decrease the power of the input signal, whereby it is possible to avoid use of the region in which the large distortion tends to appear, and to reduce the distortion level. Moreover, when a high-order distortion such as a large inflection portion or the like has occurred, if the power of the input signal is decreased and the range used for the amplifier is narrowed, the distortion level is relatively reduced. Accordingly, it is possible to suppress the influence of the high-order distortion. For this reason, for example, when the amplifying device includes the digital predistortion circuit that performs distortion compensation of the amplifier, it is possible to suppress the deterioration of the accuracy of the distortion compensation of the amplifier. As a result, it is possible to effectively suppress the distortion that appears in the input-output characteristics of the amplifier.

(3) On the other hand, when the distortion level is sufficiently lower than the allowable upper limit value, it is possible to determine that there is room to further increase the power of the input signal.

Therefore, the adjustment unit may determine whether the distortion level is lower than a second threshold value which is set to a value smaller than the first threshold value, and when determining that the distortion level is lower than the second threshold value, the adjustment unit may perform the adjustment so as to increase the power of the input signal.

In this case, when determining that the distortion level is sufficiently low after the distortion level has been reduced by the power of the input signal having been decreased, the adjustment unit performs the adjustment so as to increase the power of the input signal. Therefore, for example, also when the distortion level in the input-output characteristics of the amplifier was temporarily increased due to some cause and then reduced again, it is possible to prevent the power of the input signal from being maintained at the reduced level.

(4) Moreover, as described above, when the power of the input signal is to be decreased, there is little possibility of deterioration of the input-output characteristics of the amplifier. On the other hand, when the power of the input signal is to be increased, the level of the input signal may reach the saturation region and a large distortion may occur in the input-output characteristics of the amplifier. Therefore, it is preferable that an amount of change used when the adjustment unit increases the power of the input signal is set to a value smaller than an amount of change used when the adjustment unit decreases the power of the input signal.

Accordingly, when the power of the input signal is to be increased, the power can be gradually increased by an amount of change smaller than that used when the power is decreased, whereby it is possible to suppress a large distortion from appearing in the input-output characteristics of the amplifier.

Moreover, for example, in the case where the amplifying device includes the digital predistortion circuit that performs distortion compensation of the amplifier, when the power of the input signal is to be decreased, the adjustment is performed within the range in which the immediately preceding distortion compensation has been performed. Therefore, the distortion compensation can be performed accurately. On the other hand, when the power of the input signal is to be increased, the portion for which the power is increased is not included in the range in which the immediately preceding distortion compensation has been performed. Therefore, accurate distortion compensation may not be performed for that portion.

However, according to the above configuration, when the power of the input signal is to be increased, the power can be gradually increased by an amount of change smaller than that used when the power is decreased. Therefore, it is possible to prevent the accuracy of the distortion compensation from being greatly deteriorated.

(5) Moreover, in the above amplifying device, after adjusting the power of the input signal, the adjustment unit may wait for a predetermined time period to elapse, before adjusting the power of the input signal again. In this case, after adjusting the power of the input signal, it is possible to provide a time interval for the timing at which the adjustment of the power is performed again. As a result, it is possible to suppress occurrence of hunting, such as frequent alternate repetition of the power-increasing adjustment and the power-decreasing adjustment, when the processing for the power adjustment of the input signal is performed.

(6) (7) Moreover, for example, when the maximum power value of the input signal is relatively large and is located near the saturation region in the input-output characteristics of the amplifier, if the power of the input signal is greatly changed, the distortion level may be greatly changed.

Therefore, the adjustment unit may adjust the amount of change for the power adjustment of the input signal, in accordance with the power of the input signal, and more specifically, may preferably perform the adjustment in accordance with the maximum power value of the input signal. Accordingly, when the maximum power value of the input signal is relatively large, which may cause a great change in the distortion level, the amount of change for the power adjustment of the input signal can be adjusted to a small value. Consequently, it is possible to suppress a large distortion from appearing in the input-output characteristics of the amplifier.

Accordingly, for example, in the case where the amplifying device includes the digital predistortion circuit that performs the distortion compensation of the amplifier, even when the distortion level may be greatly changed because the maximum power value of the input signal is located near the saturation region, it is possible to suppress deterioration of the accuracy of the distortion compensation, by adjusting the amount of change for the power adjustment of the input signal to a small value. As a result, it is possible to suppress a large distortion from appearing in the input-output characteristics of the amplifier.

(8) Moreover, when the distortion level has abruptly changed to a great extent, in order to reduce the distortion level promptly, there arises a necessity to greatly change the power of the input signal in accordance with the change. Therefore, the adjustment unit may adjust the amount of change for the power adjustment of the input signal, in accordance with the distortion level. In this case, even when the distortion level has abruptly changed to a great extent, the distortion level can be reduced promptly.

(9) In the above amplifying device, the distortion level detection unit may obtain an output signal from the amplifier, may determine a leakage power ratio of a power of an adjacent frequency band adjacent to an available frequency band, which is available for the output signal, to a power of the available frequency band, and may output the leakage power ratio as the distortion level.

In this case, the output signal may be divided into components of the available frequency band and components of the adjacent frequency band, and the powers thereof may be compared with each other. Therefore, it is possible to detect the distortion level through a simple configuration.

(10) The above amplifying device may further include a predistorter that estimates a model representing the input-output characteristics of the amplifier by using the input signal and an output signal outputted by the amplifier in response to the input signal, and that performs distortion compensation of the amplifier by using the model, wherein the distortion level detection unit may determine, as an amount of modeling error, a difference between the model estimated by the predistorter and the input-output characteristics of the amplifier expressed based on the input signal and the output signal, and may output the amount of modeling error as the distortion level.

In this case, it is possible to know the error amount between the estimated model and the input-output characteristics based on the actual input and output signals. Accordingly, the adjustment unit can perform the power adjustment of the input signal based on the error amount. As a result, it is possible to perform distortion compensation having a higher accuracy, and it is possible to effectively suppress the distortion appearing in the input-output characteristics of the amplifier.

(11) Since the amplifying device of the present invention obtains the output signal outputted by the amplifier as an output monitor signal that has been fed back, and controls (performs distortion compensation on) the input signal, it is preferable that the adjustment unit indirectly adjusts the power of the input signal by adjusting the power of the output signal to be obtained by the predistorter.

In this case, the predistorter obtains the output signal (output monitor signal), the power of which has been adjusted by the adjustment unit, and performs the distortion compensation thereon, whereby the power adjustment of the input signal is indirectly performed. Therefore, the power adjustment of the input signal can be performed with the distortion compensation performed. Accordingly, it is possible to adjust the power of the input signal while suppressing deterioration of the accuracy of the distortion compensation of the amplifier.

(12) Further, the adjustment unit may directly adjust the power of the input signal. In this case, it is advantageous in that the power adjustment is reflected immediately.

(13) Further, an amplifying device of the present invention includes: an amplifier that amplifies a power of an input signal; a power supply unit that applies a power supply voltage to the amplifier; a distortion level detection unit that detects a distortion level of distortion that appears in input-output characteristics of the amplifier; and a power supply voltage adjustment unit that adjusts the power supply voltage in accordance with the distortion level.

The amplifying device having the above configuration includes the power supply voltage adjustment unit that adjusts the power supply voltage in accordance with the distortion level detected by the distortion level detection unit. Accordingly, even when a large distortion has occurred in the input-output characteristics of the amplifier due to a temperature change or aged deterioration, the power supply voltage can be adjusted in the direction in which the distortion is suppressed in accordance with the distortion level. As a result, the distortion appearing in the input-output characteristics of the amplifier can be suppressed.

(14) Preferably, the above amplifying device further includes a signal power adjustment unit that adjusts, when the distortion level at a time when the power supply voltage has been adjusted by the power supply voltage adjustment unit is greater than a predetermined third threshold value, the power of the input signal in accordance with the distortion level at the time when the power supply voltage has been adjusted.

In this case, when the distortion cannot be suppressed to a predetermined level as a result of the adjustment of the power supply voltage performed by the power supply voltage adjustment unit, it is possible to adjust the power of the input signal in the direction in which the distortion is further suppressed by the signal power adjustment unit, in addition to the adjustment of the power supply voltage.

As a result, the power adjustment of the input signal performed by the signal power adjustment unit can complement the distortion suppression effect by the adjustment of the power supply voltage performed by power supply voltage adjustment unit. Accordingly, it is possible to more effectively suppress the distortion that appears in the input-output characteristics of the amplifier.

(15) Further, the present invention is directed to a wireless transmission device including an amplifying device that is the amplifying device according to the above (1) to (14).

Since the wireless transmission device having the above configuration includes the above described amplifying device, even when a large distortion has occurred in the input-output characteristics of the amplifier due to a temperature change or aged deterioration, it is possible to suppress the distortion.

Moreover, with respect to the amplifying device according to (13), the following configuration other than that of the present invention may be considered.

That is, another configuration is an amplifying device including: an amplifier that amplifies a power of an input signal; a power supply unit that applies a power supply voltage to the amplifier; a distortion level detection unit that detects a distortion level of distortion that appears in input-output characteristics of the amplifier; and a power supply voltage adjustment unit that adjusts the power supply voltage in accordance with the distortion level, wherein the power supply voltage adjustment unit determines whether the distortion level detected by the distortion level detection unit is greater than a fourth threshold value predetermined as an upper limit value that is allowable as the distortion level, and when determining that the distortion level is greater than the fourth threshold value, the power supply voltage adjustment unit performs the adjustment so as to increase the power supply voltage.

According to this configuration, if the power supply voltage is adjusted so as to be increased, the saturation region of the amplifier can be relatively raised. Therefore, when the distortion of the input-output characteristics of the amplifier 4 appears as a lowered saturation region, adjustment is performed in the direction in which the distortion within the power range of the input signal is suppressed. Consequently, the distortion appearing in the input-output characteristics of the amplifier 4 can be suppressed.

In the another configuration, the power supply voltage adjustment unit may determine whether the distortion level is lower than a fifth threshold value which is set to a smaller value than the fourth threshold value, and when determining that the distortion level is lower than the fifth threshold value, the power supply voltage adjustment unit may perform the adjustment so as to decrease the power supply voltage.

In this case, when determining that the distortion level is sufficiently small after the distortion level has been reduced by the power supply voltage having been increased, the power supply voltage adjustment unit performs the adjustment so as to decrease the power supply voltage. Therefore, for example, also when the distortion level in the input-output characteristics of the amplifier was temporarily increased due to some cause and then reduced again, it is possible to prevent the power supply voltage from being maintained at the increased level.

In the another configuration, it is preferable that the amount of change used when the power supply voltage adjustment unit decreases the power of the power supply voltage is set to a value smaller than the amount of change used when the power supply voltage adjustment unit increases the power supply voltage.

In this case, when the power supply voltage is to be decreased, it is possible to decrease the power supply voltage gradually by an amount of change smaller than that used when the power supply voltage is increased. Therefore, it is possible to suppress a large distortion from occurring in the input-output characteristics of the amplifier due to the adjustment.

In the another configuration, it is preferable that after adjusting the power supply voltage, the power supply voltage adjustment unit waits for a predetermined time period to elapse, before adjusting the power supply voltage again.

In this case, it is possible to provide a time interval for the timing at which the adjustment of the power supply voltage is performed again after the adjustment of the power supply voltage has been performed. As a result, it is possible to suppress hunting from occurring when the processing for the adjustment of the power supply voltage is performed.

Further, when the distortion level has abruptly changed to a great extent, in order to reduce the distortion level promptly, there arises a necessity to change the power supply voltage to a great extent in accordance with the change of the distortion level. Thus, the power supply voltage adjustment unit may be configured to adjust the amount of change for the adjustment of the power supply voltage, in accordance with the distortion level.

In this case, even when the distortion level has abruptly changed to a great extent, it is possible to reduce the distortion level promptly.

Further, the distortion level detection unit may obtain an output signal from the amplifier, may determine a leakage power ratio of a power of an adjacent frequency band adjacent to an available frequency band, which is available for the output signal, to a power of the available frequency band, and may output the leakage power ratio as the distortion level.

In this case, it is suffice to divide the output signal into components of the available frequency band and components of the adjacent frequency bands, and to compare the powers thereof. Therefore, it is possible to detect the distortion level with a simple configuration.

Moreover, the another configuration may further include a predistorter that estimates a model representing the input-output characteristics of the amplifier by using the input signal and an output signal outputted by the amplifier in response to the input signal, and that performs distortion compensation of the amplifier by using the model, and the distortion level detection unit may determine, as an amount of modeling error, a difference between the model estimated by the predistorter and the input-output characteristics of the amplifier expressed based on the input signal and the output signal, and may output the amount of modeling error as the distortion level.

In this case, it is possible to know the error amount between the estimated model and the input-output characteristics based on the actual input and output signals. Accordingly, the adjustment unit can to perform adjustment of the power supply voltage based on the error amount. As a result, it is possible to perform distortion compensation having a higher accuracy, and it is possible to efficiently suppress the distortion that appears in the input-output characteristics of the amplifier.

Advantageous Effects of the Invention

As described above, according to the amplifying device of the present invention and the wireless transmission device using the same, even when a large distortion has occurred due to a temperature change or aged deterioration in the input-output characteristics of the amplifier, it is possible to suppress the distortion appearing in the input-output characteristics of the amplifier.

DESCRIPTION OF EMBODIMENTS

Next, a preferable embodiment of the present invention will be described with reference to attached drawings.

Figure 1:
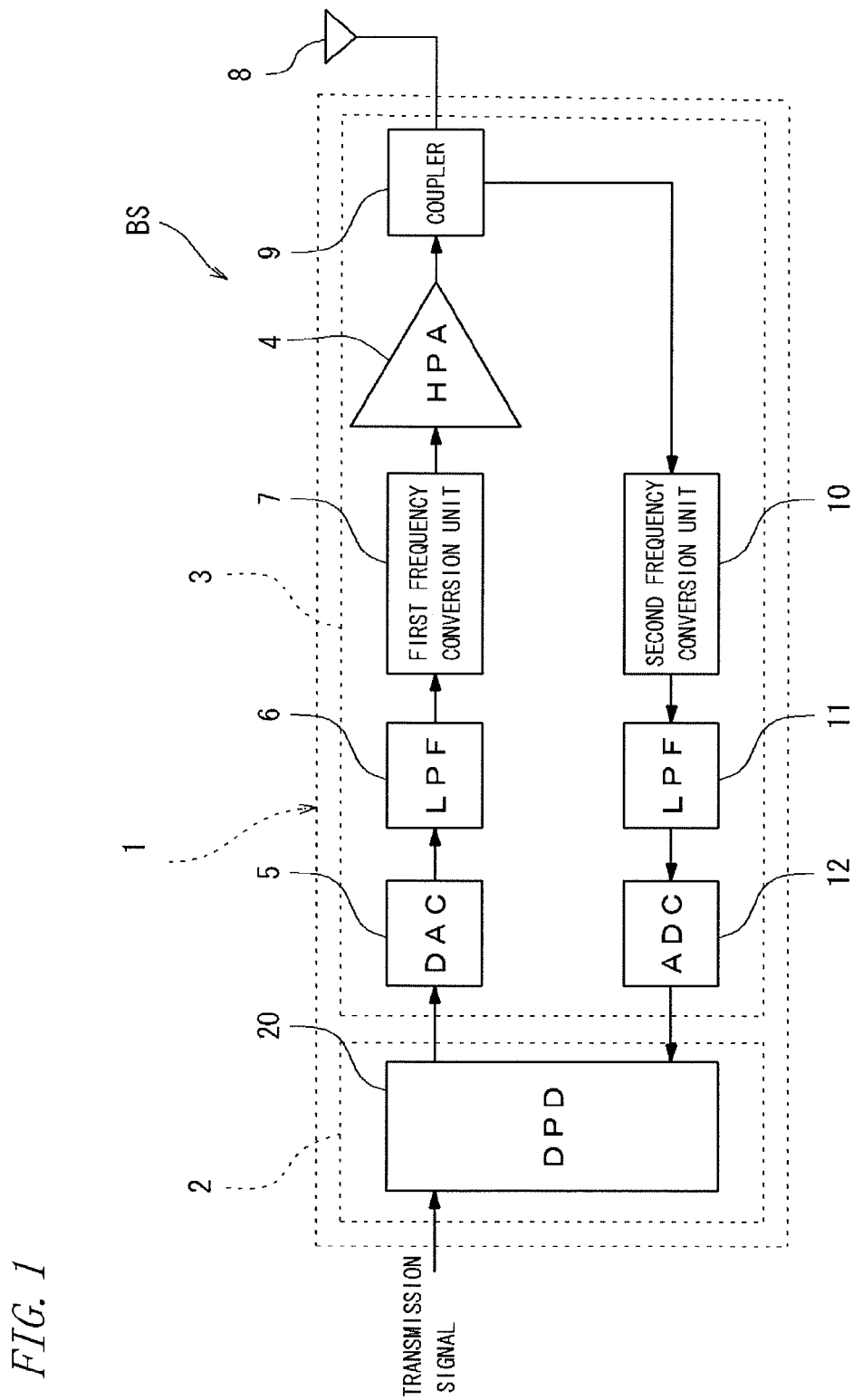
FIG. 1 is a circuit diagram showing an amplifying device for wireless transmission performed by a base station device according to a first embodiment of the present invention.

FIG. 1 is a circuit diagram showing an amplifying device for wireless transmission performed by a base station device according to a first embodiment of the present invention. The base station device BS is configured to be used as a transmission device of a wideband mobile wireless communication system, and is configured in conformance with, for example, a wireless communication system called "WiMAX (Worldwide Interoperability for Microwave Access)" specified by IEEE802.16. The base station device BS includes an amplifying device 1 for amplifying transmission signals.

The amplifying device 1 includes a digital processing unit 2 functionally having the digital predistortion circuit (DPD) 20, and an analog processing unit 3 having a high power amplifier (HPA, hereinafter also simply referred to as amplifier) 4.

The digital processing unit 2 provides the analog processing unit 3 with a transmission signal, which is an input signal to be inputted to the amplifier 4, as a digital signal. Moreover, the digital processing unit 2 obtains an output signal outputted by the amplifier 4 from the analog processing unit 3, as a digital signal.

The analog processing unit 3 includes a digital/analog converter (DAC) 5, a low-pass filter (LPF) 6, and a first frequency conversion unit 7, which are arranged and connected between the digital processing unit 2 and a signal input terminal of the amplifier 4. A digital input signal outputted by the digital processing unit 2 is passed through these components to be converted into an analog signal having a carrier frequency, and then provided to the amplifier 4.

An antenna 8 is connected to an output terminal of the amplifier 4, and the output signal outputted by the amplifier 4 is transmitted from the antenna 8, as a transmission signal.

The analog processing unit 3 further includes a coupler 9 for obtaining the output signal from the amplifier 4, a second frequency conversion unit 10, a low-pass filter 11, and an analog/digital converter (ADC) 12, which are arranged and connected between a signal output terminal of the amplifier 4 and the digital processing unit 2.

An output signal from the amplifier 4 is passed through these components to be converted into a digital signal having a baseband frequency, and then provided to the digital processing unit 2.

Figure 2:
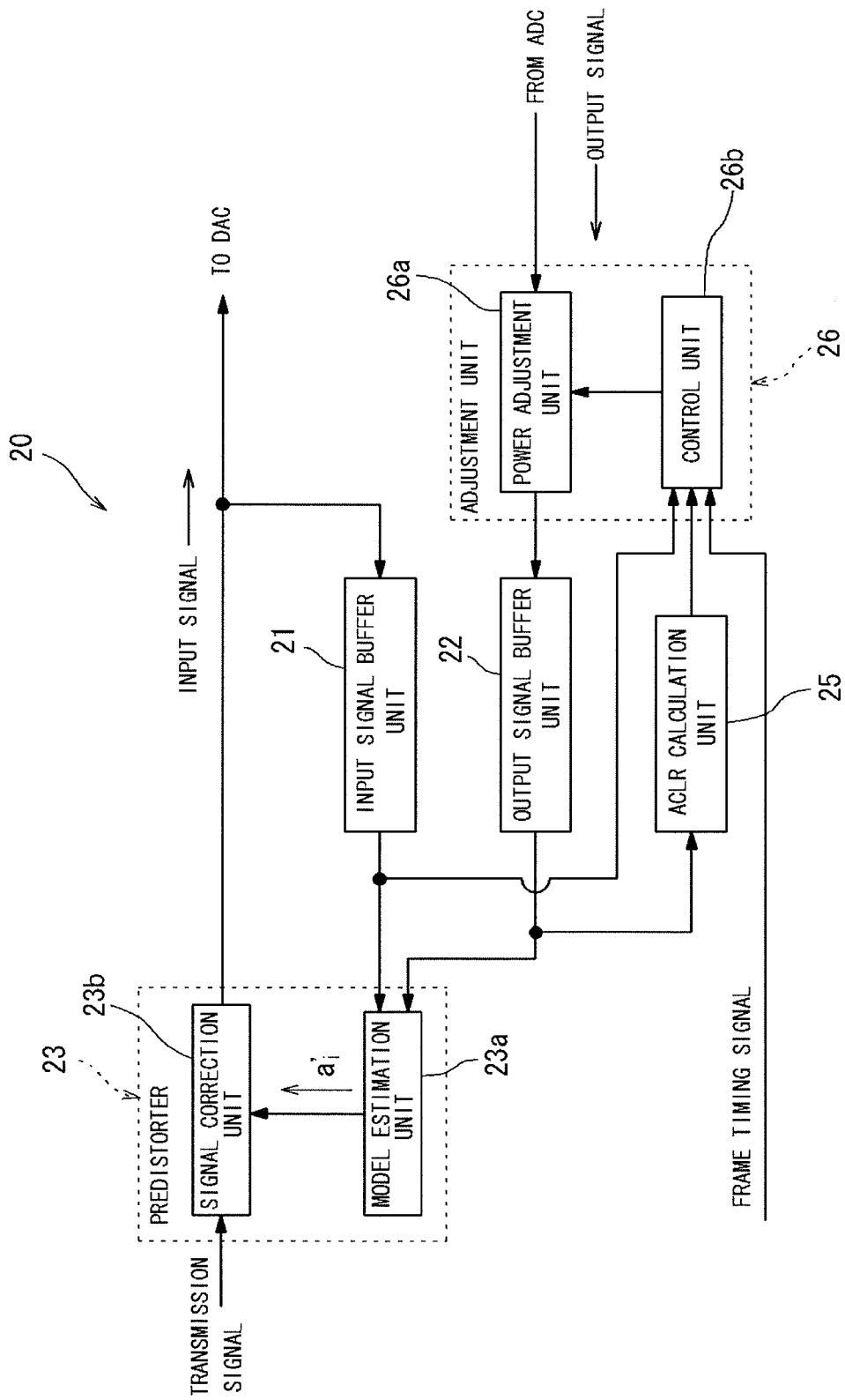
FIG. 2 is a functional block diagram of a digital predistortion circuit that a digital processing unit functionally has.

FIG. 2 is a functional block diagram of a digital predistortion circuit that the digital processing unit 2 functionally has.

A digital predistortion circuit 20 estimates input-output characteristics of the amplifier 4 based on the input signal to the amplifier 4 and the output signal from the amplifier 4 obtained from the analog processing unit 3, and performs distortion compensation processing on the input-output characteristics, thereby yielding desired amplification characteristics. That is, the digital predistortion circuit 20 obtains the output signal outputted by the amplifier 4 as a feedback signal to control (compensate distortion of) the input signal.

The digital predistortion circuit 20 includes an input signal buffer unit 21 for accumulating the input signal provided to the amplifier 4, an output signal buffer unit 22 for accumulating an output signal outputted by the amplifier 4 in response to the input signal accumulated in the input signal buffer unit 21, and a predistorter 23 which obtains the input signal and the output signal accumulated in the buffer units 21 and 22, respectively, and which performs distortion compensation of the amplifier 4.

The digital predistortion circuit 20 further includes an ACLR calculation unit 25 which obtains the output signal from the output signal buffer unit 22 and determines the adjacent channel leakage ratio (hereinafter also referred to as ACLR value) of the output signal, and an adjustment unit 26 for adjusting the power of the input signal.

The predistorter 23 includes a model estimation unit 23a which estimates a model representing the input-output characteristics of the amplifier 4, and a signal correction unit 23b which corrects a transmission signal (signal before distortion compensation) to be provided to the amplifying device 1, to perform distortion compensation based on the model of the input-output characteristics estimated by the model estimation unit 23a.

The signal correction unit 23b corrects (performs distortion compensation processing onto) the transmission signal (signal before distortion compensation) to be provided to the amplifying device 1 in accordance with the input-output characteristics of the amplifier 4, and outputs an input signal (signal after distortion compensation) to be inputted to the amplifier 4. The amplifier 4 is provided with the input signal to which the distortion compensation has been performed in advance, from the predistorter 23. Therefore, the amplifier 4 can output an output signal having no (or less) distortion.

Here, the input-output characteristics of the amplifier 4 are nonlinear, and are expressed, for example, by a power series polynomial represented by equation (1). In equation (1), z is the output signal from the amplifier 4, y is the input signal to the amplifier 4, and $a_i$ is a coefficient of each order.

[Equation 1]

$$z = \sum_i a_i \cdot y^i \quad (1)$$

The signal correction unit 23b calculates the power series polynomial represented by equation (2) below based on equation (1), to determine the input signal y of the amplifier 4. In equation (2), $a_i'$ is the coefficient of each order representing the inverse characteristics of the amplifier, and x is the input signal to the amplifier 4 before distortion compensation.

[Equation 2]

$$y = \sum_i a_i' \cdot x^i \quad (2)$$

As shown in equation (2), the signal correction unit 23b performs distortion compensation by adding the inverse characteristics of the distortion characteristics of the amplifier 4 to the input signal x before distortion compensation, based on the coefficient $a_i'$ of each order representing the inverse characteristics of the amplifier 4 serving as a model representing the input-output characteristics of the amplifier 4, and thereby cancelling the distortion caused by the amplifier 4.

The coefficient $a_i'$ of each order representing the inverse characteristics of the amplifier 4 in equation (2) is determined by the model estimation unit 23a. The model estimation unit 23a obtains input and output signal data regarding the input signal y and the output signal z of the amplifier 4, and estimates a model (inverse model) representing the input-output characteristics of the amplifier 4 based on the input and output signal data. The model estimation unit 23a determines the coefficient $a_i'$ of each order as a result of the estimation of the model.

The model estimation unit 23a includes an amplifier model (inverse model) in which the input signal y is expressed by a power polynomial of the output signal z, applies the input and output signals obtained from the input signal buffer unit 21 and the output signal buffer unit 22 to this model, and estimates a corresponding model. The model estimation unit 23a outputs to the signal correction unit 23b the coefficient of each order which is the value representing the estimated model, as the coefficient $a_i'$ of each order representing the inverse characteristics of the amplifier 4.

The input signal buffer unit 21 accumulates the input signal to be provided to the amplifier 4 for a period of sampling section set as a time section having a predetermined duration. Further, similarly to the input signal buffer unit 21, the output signal buffer unit 22 also accumulates the output signal from the amplifier 4 for a period of sampling section having a predetermined duration. The timing at which the output signal buffer unit 22 accumulates the output signal is adjusted such that output signal buffer unit 22 accumulates the output signal that corresponds to the input signal accumulated in the input signal buffer unit 21. The output signal buffer unit 22 obtains and accumulates the output signal from the analog processing unit 3 via the adjustment unit 26. The adjustment unit 26 will be described later.

As described above, the ACLR calculation unit 25 obtains the output signal from the output signal buffer unit 22 and determines the ACLR of the output signal. The ACLR calculation unit 25 includes: a band-pass filter (not shown) for obtaining, from the obtained output signal, frequency components of an available frequency band that can be used for the output signal, and frequency components of adjacent frequency bands that are adjacent to the available frequency band; and an operation unit (not shown) for determining the power ratio of these components. Here, the available frequency band is a band containing the frequency band to be used for a transmission signal from the base station device BS and the frequency bands that are allowed to be used for a transmission signal. That is, the available frequency band is a frequency band that can be used for a transmission signal from the base station device BS which includes the digital predistortion circuit 20.

Figure 3:
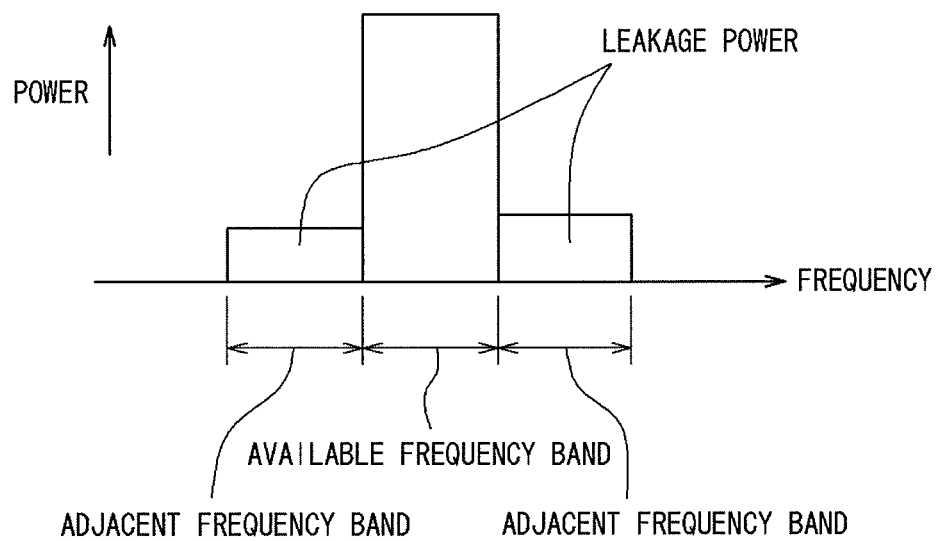
FIG. 3 is a diagram for explaining processing performed on an output signal by an ACLR calculation unit.

FIG. 3 is a diagram for explaining processing performed on the output signal by the ACLR calculation unit 25. In FIG. 3, the horizontal axis represents frequency and the vertical axis represents power.

By using the above described band-pass filter, the ACLR calculation unit 25 separates, from the output signal, the frequency components of the available frequency band from the frequency components of the adjacent frequency bands that are adjacent to this available frequency band in the frequency axis direction, and obtains them separately.

That is, the ACLR calculation unit 25 obtains the components of the adjacent frequency bands as a leakage power. If there is distortion in the input-output characteristics of the amplifier 4, the frequency of the output signal is disturbed, leading to a leakage power in the adjacent frequency bands. Therefore, by numerically expressing the frequency components of the adjacent frequency bands having the leakage power, it is possible to numerically express the distortion in the amplifier 4 as a distortion level.

For the ACLR calculation unit 25, it is suffice to divide the output signal into components of the available frequency band and components of the adjacent frequency bands, and to compare the powers thereof. Therefore, it is possible to detect the distortion level with a simple configuration.

The ACLR calculation unit 25 obtains the power of the components of each of the obtained frequency bands. Then, using the average value of the power of the components of both adjacent frequency bands as the leakage power, the operation unit determines the power ratio of the leakage power to the power of the components of the available frequency band (ACLR value: ACLR value=(leakage power)/(power of components of available frequency band)).

In this manner, the ACLR calculation unit 25 forms a distortion level detection unit which numerically expresses the frequency components of the adjacent frequency bands, the components representing the leakage power, as the ACLR value, and which detects the ACLR value as the distortion level.

With reference back to FIG. 2, the adjustment unit 26 has a function of adjusting the power of the input signal, based on the ACLR value outputted by the ACLR calculation unit 25.

The adjustment unit 26 includes a power adjustment unit 26a provided between the analog processing unit 3 and the output signal buffer unit 22, and a control unit 26b for controlling the power adjustment unit 26a.

The power adjustment unit 26a has a function of adjusting the power of the output signal from the analog processing unit 3, based on the control by the control unit 26b.

The control unit 26b determines the manner of power adjustment of the input signal, based on the ACLR value from the ACLR calculation unit 25. The control unit 26b obtains from the input signal buffer unit 21 an input signal that corresponds to the output signal that has been used as the base for the ACLR value, and also determines the amount of change for the power adjustment of the input signal, in accordance with the maximum power value of the obtained input signal.

Further, the control unit 26b obtains from a signal processing unit (not shown), which is included in the base station device BS and which performs digital baseband processing, a signal (frame timing signal) indicating the timing for a unit frame contained in a communication frame used for transmitting a transmission signal, and controls the power adjustment unit 26a such that the power of the input signal is adjusted at a timing other than the timing at which base station device BS transmits a transmission signal.

The communication frame is composed of a plurality of unit frames arranged in the time axis direction. Each unit frame is composed of a downlink subframe (DL frame), which is the transmission time period of the base station device BS, and an uplink subframe (UL frame), which is the transmission time period of a mobile terminal that performs communications with the base station device BS. The control unit 26b controls the power adjustment unit 26a such that the power adjustment unit 26a does not perform power adjustment of the input signal in the DL frame and performs the adjustment in other time period than the DL frame. If the power adjustment is performed in the DL frame, the demodulation accuracy of the data stored in the DL frame is reduced due to an increase or decrease of the power. In contrast, in the present embodiment, since the power of a transmission signal transmitted by the base station device BS is not adjusted in the DL frame, such a reduction of the demodulation accuracy can be prevented.

When the power of the input signal is to be adjusted, the control unit 26b controls the power adjustment unit 26a to adjust the power of the output signal (output monitor signal) from the analog processing unit 3 (ADC 12), whereby the control unit 26b indirectly adjusts the power of the input signal.

Here, the output monitor signal obtained from the analog processing unit 3 is subjected to distortion compensation performed by the model estimation unit 23a and the signal correction unit 23b. The model estimation unit 23a estimates an inverse model of the input-output characteristics of the amplifier 4 which are obtained from the input and output signals, and the signal correction unit 23b adds the inverse characteristics based on the inverse model to the input signal, whereby the distortion compensation is performed. Accordingly, if a power smaller than the actual power of the output monitor signal is provided to the model estimation unit 23a, the model estimation unit 23a attempts to increase the power so as to compensate for the amount of change by which the power has been decreased, and estimates an inverse model that will increase the power by the amount of change. The signal correction unit 23b corrects (performs distortion compensation on) the power of the input signal based on this inverse model. Meanwhile, the power of the output signal has not actually been decreased. Therefore, the power of the input signal is adjusted so as to be increased relative to the actual state based on the inverse model.

In contrast, in order to perform adjustment so as to decrease the power of the input signal, if a power greater than the actual power of the output monitor signal is provided to the model estimation unit 23a, the power of the input signal is adjusted so as to be decreased relative to the actual state. Since the amount of change for the adjustment is reflected in the inverse model estimated by the model estimation unit 23a, if the power of the output monitor signal is adjusted by a certain amount of change, it is also possible to adjust the power of the input signal by the certain amount of change.

That is, the predistorter 23 obtains the output signal outputted by the amplifier 4 as the output monitor signal that has been fed back, and controls (performs distortion compensation on) the input signal. In order to perform adjustment so as to increase the power of the input signal, the control unit 26b causes the power adjustment unit 26a to perform adjustment so as to decrease the power of the output monitor signal. In order to perform adjustment so as to decrease the power of the input signal, the control unit 26b causes the power adjustment unit 26a to perform adjustment so as to increase the power of the output monitor signal. In this manner, the control unit 26b can indirectly adjust the power of the input signal.

In this case, the predistorter 23 obtains the output signal, the power of which has been adjusted by the adjustment unit 26, and performs the distortion compensation thereon, whereby the power adjustment of the input signal is indirectly performed. Therefore, the predistorter 23 and the adjustment unit 26 can perform the power adjustment of the input signal while performing the distortion compensation. As a result, the power of the input signal can be adjusted while the deterioration of the distortion compensation accuracy of the amplifier 4 is suppressed.

Figure 4:
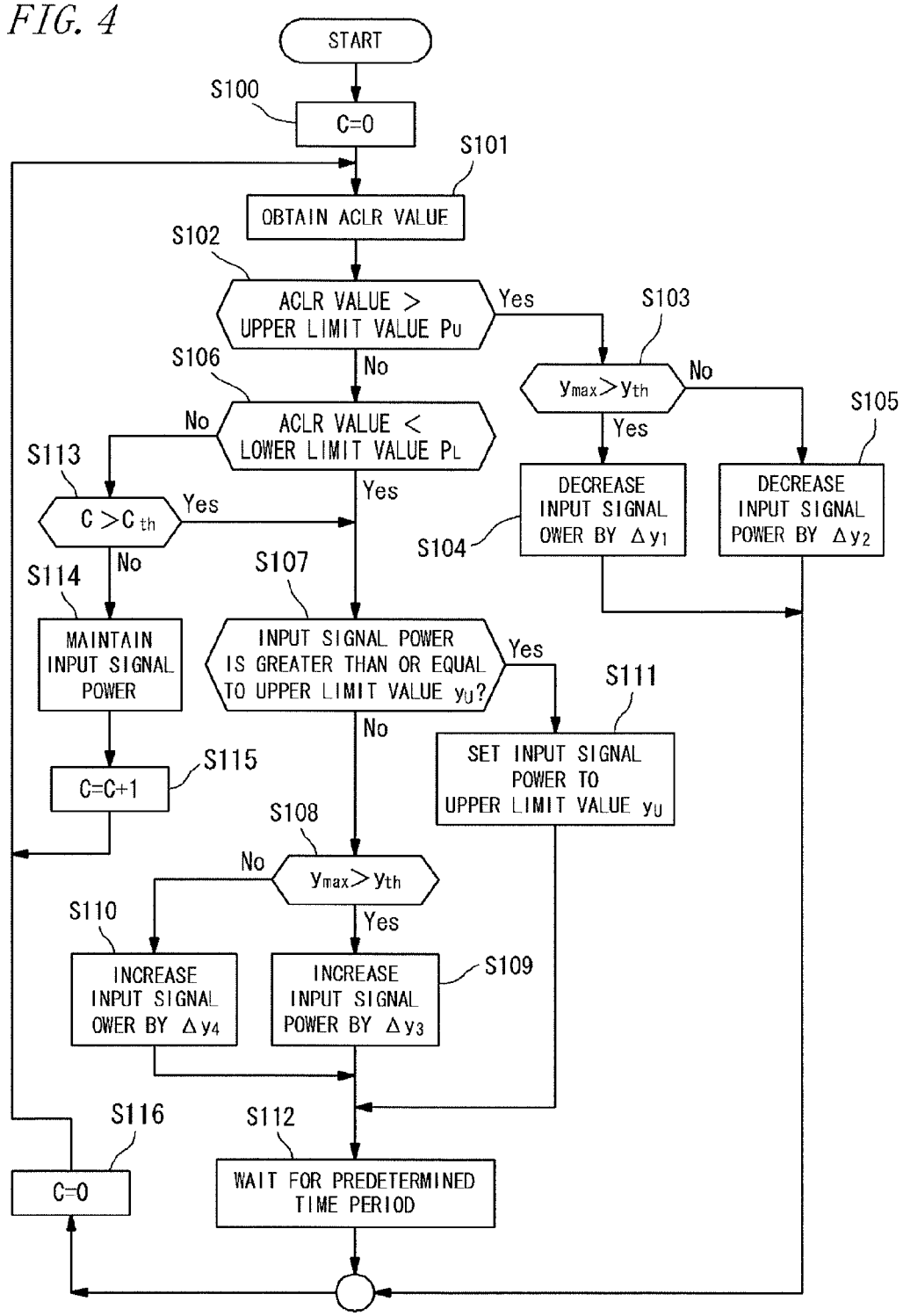
FIG. 4 is a flow chart showing processing of power adjustment of an input signal performed by a control unit of an adjustment unit.

Next, processing performed by the adjustment unit 26 will be specifically described. FIG. 4 is a flow chart showing the processing of the power adjustment of the input signal performed by the control unit of the adjustment unit.

First, the control unit 26b sets a counter value C, which the control unit 26b has as its own function, to "0" (step S100). Then, upon obtaining an ACLR value from the ACLR calculation unit 25 (step S101), the control unit 26b determines whether the ACLR value is greater than an upper limit value $P_U$ which is used as a first threshold value (step S102).

Here, the upper limit value $P_U$ is set to an upper limit value that is allowable as the level of distortion contained in an output signal.

Upon determining that the ACLR value is greater than the upper limit value $P_U$ in step S102, the control unit 26b determines whether a maximum power value $y_{max}$ of a corresponding input signal is greater than a predetermined threshold value $y_{th}$ (step S103). Upon determining that the maximum power value $y_{max}$ of the input signal is greater than the threshold value $y_{th}$, the control unit 26b determines to decrease the power of the input signal by an amount of change$\Delta y_1$. Based on the determination, the control unit 26b causes the power adjustment unit 26a to perform power adjustment of the output signal (step S104). Upon determining that the maximum power value $y_{max}$ of the input signal is not greater than the threshold value $y_{th}$, the control unit 26b determines to decrease the power of the input signal by an amount of change$\Delta y_2$, which is a value greater than the amount of change$\Delta y_1$. Based on the determination, the control unit 26b causes the power adjustment unit 26a to perform power adjustment of the output signal (step S105).

As shown in FIGS. 5(a) and 5(b), the maximum power value $y_{max}$ of the input signal represents the maximum value of the power of the input signal in the case where, for example, the power of the input signal is adjusted so as to be contained within the range L1. The threshold value $y_{th}$ is set to a value smaller than the lowest power value that can be the boundary between the saturation region and the non-saturation region of the amplifier 4.

The power adjustment of the input signal is performed by the power adjustment unit 26a such that: an amount of change is added to or subtracted from the maximum power value $y_{max}$ of the input signal, and based on the result, the power value of the entire input signal is linearly increased or decreased. For example, the power adjustment in step S104 is performed such that: the amount of change $\Delta y_1$ is subtracted from the maximum power value $y_{max}$, and based on the resultant power value, subtraction is linearly performed on the power values less than or equal to the maximum power value.

As described above, when determining that the ACLR value is greater than the upper limit value $P_U$ in step S102, the control unit 26b determines that the distortion level of the input-output characteristics of the amplifier 4 exceeds the tolerable range, and performs adjustment so as to decrease the power of the input signal (steps S104 and S105). Then, the control unit 26b sets the counter value C to "0" and returns to step S101.

Meanwhile, upon determining that the ACLR value is not greater than the upper limit value $P_U$ in step S102, the control unit 26b determines whether the ACLR value is smaller than a lower limit value $P_L$ which is used as a second threshold value (step S106). The lower limit value $P_L$ is set to a value that is smaller than the upper limit value $P_U$ and that has a distortion level that is low enough to allow determination that there is room to further increase the power of the input signal while maintaining the distortion compensation accuracy.

Upon determining that the ACLR value is smaller than the lower limit value $P_L$ in step S106, the control unit 26b determines whether (the maximum power value $y_{max}$ of) the input signal power is greater than or equal to a predetermined upper limit value $y_u$ (see FIG. 5) (step S107).

Upon determining that the input signal power is not greater than or equal to the upper limit value $y_u$ in step S107, the control unit 26b determines whether the maximum power value $y_{max}$ of the corresponding input signal is greater than the predetermined threshold value $y_{th}$ (step S108).

Upon determining that the maximum power value $y_{max}$ of the input signal is greater than the threshold value $y_{th}$ in step S108, the control unit 26b determines to increase the power of the input signal by an amount of change$\Delta y_3$. Based on the determination, the control unit 26b causes the power adjustment unit 26a to perform power adjustment of the output signal (step S109).

Upon determining that the maximum power value $y_{max}$ of the input signal is not greater than the threshold value $y_{th}$, the control unit 26b determines to increase the power of the input signal by an amount of change$\Delta y_4$, which is a value greater than the amount of change$\Delta y_3$. Based on the determination, the control unit 26b causes the power adjustment unit 26a to perform power adjustment of the output signal (step S110).

As described above, when determining in step S106 that the ACLR value is smaller than the lower limit value $P_L$ and the input signal power is not greater than or equal to the upper limit value $y_u$, the control unit 26b determines that the power of the input signal can be increased, and performs adjustment so as to increase the power of the input signal (steps S109 and S110).

Note that the amount of change$\Delta y_4$ is set to a value smaller than the amount of change$\Delta y_1$. Therefore, the amount of change used when the power of the input signal is increased is set to a value smaller than the amount of change used when the power is decreased.

Meanwhile, upon determining that the input signal power is greater than or equal to the upper limit value $y_u$ in step S107, the control unit 26b sets (the maximum power value $y_{max}$ of) the input signal power to the upper limit value $y_u$ (step S111). Note that the upper limit value $y_u$ is set to the maximum value of an input power to which value the amplifier 4 can actually amplify the input power. Through the above configuration, the control unit 26b can perform control such that an input signal having a power greater than the upper limit value $y_u$ is not to be inputted to the amplifier 4.

After adjusting the power of the input signal so as to be increased in steps S109 and S110, or after determining to set the power of the input signal to the upper limit value $y_u$ in step S111, the control unit 26b waits for a predetermined time period (step S112), then sets the counter value C to "0" (step S116), and returns to step S101.

As described above, after adjusting the power of the input signal, the control unit 26b waits for a predetermined time period, and thus, can provide a time interval for the timing at which the adjustment of the power of the input signal is performed. As a result, it is possible to suppress hunting from occurring when the processing for the power adjustment of the input signal is performed. Accordingly, it is possible to prevent a great change in the power of a transmission signal from occurring when the power adjustment is performed, and it is possible to reduce the influence on the mobile terminal that receives the transmission signal from the base station device BS.

The timing from which the control unit 26b waits for the predetermined time period may be set to a timing either after the power of the input signal has been adjusted so as to be increased or after the power thereof has been adjusted so as to be decreased. However, it is preferable that the timing is set after the power of the input signal has been adjusted so as to be increased, as in the present embodiment. The reason is as follows. As described below, when the power of the input signal is to be increased, the increase may be performed gradually. However, when it is determined to decrease the power, the adjustment has to be performed immediately because distortion is currently occurring.

Returning to step S106, upon determining that the ACLR value is not smaller than the lower limit value $P_L$ (step S106), the control unit 26b determines whether the counter value C is greater than a predetermined threshold value $C_{th}$ (step S113).

Upon determining that the counter value C is greater than the threshold value $C_{th}$, the control unit 26b advances to step S107 and performs adjustment so as to increase the input signal power (steps S108, S109, S110, and S111).

On the other hand, upon determining that the counter value C is not greater than the threshold value $C_{th}$, the control unit 26b determines to maintain the power of the input signal (step S114). Accordingly, the control unit 26b causes the power adjustment unit 26a to maintain the power of the output signal.

Then, the control unit 26b adds "1" to the counter value C (step S115), and returns to step S101.

That is, in the state where the ACLR value is maintained between the upper limit value $P_U$ and the lower limit value $P_L$, the value of the counter value C is incremented every time the ACLR value is obtained. When the counter value C becomes greater than the threshold value $C_{th}$ as a result of the increment, the control unit 26b performs adjustment so as to increase the input signal power. That is, when the state where the ACLR value is maintained between the upper limit value $P_U$ and the lower limit value $P_L$ continues for a predetermined time period, the control unit 26b performs control so as to increase the input signal power.

Note that the threshold value $C_{th}$ is a value that sets the predetermined time period until the determination to increase the input signal power is made, based on the time interval at which the ACLR value is obtained. The threshold value $C_{th}$ is set to a value that can ensure a time period that allows determination that the ACLR value has become stable.

For example, when the distortion level has temporarily been increased due to some cause, the control unit 26b decreases the distortion level by performing adjustment so as to decrease the input signal. However, there are some cases where the cause that has temporarily increased the distortion level is eliminated. In such a case, the distortion level is maintained at a low level, but the elimination of the cause that increased the distortion level creates room for increasing the power of the input signal.

In the present embodiment, also in the above situation, after the ACLR value is stably maintained between the upper limit value $P_U$ and the lower limit value $P_L$ for a predetermined time period, adjustment is performed so as to increase the input signal power. Therefore, also when the distortion level has become stable after the input signal power was decreased, adjustment is started such that the input signal power is increased. Accordingly, it is possible to adjust the input signal such that the input signal has as high a power as possible, while the distortion level is being suppressed.

Since the digital predistortion circuit 20 as configured above includes the adjustment unit 26 which adjusts the power of the input signal in accordance with the ACLR value representing the distortion level detected by the ACLR calculation unit 25, even when a large distortion has occurred in the input-output characteristics of the amplifier due to a temperature change or aged deterioration, it is possible to adjust the power of the input signal to a level that allows distortion compensation to be performed in accordance with the distortion level. Consequently, it is possible to suppress deterioration of the accuracy of the distortion compensation.

More specifically, in a region where the power of the input signal is relatively high, a large distortion tends to appear due to fluctuation and the like of the saturation region. FIG. 5(a) is a schematic diagram showing input-output characteristics of an amplifier in a normal state and in a state where a large distortion is appearing. FIG. 5(b) shows the input signal associated with the input-output characteristics.

In FIG. 5(a), the broken line represents input-output characteristics in the normal state, and the solid line represents an example of input-output characteristics when a large distortion is appearing.

Figure 5:
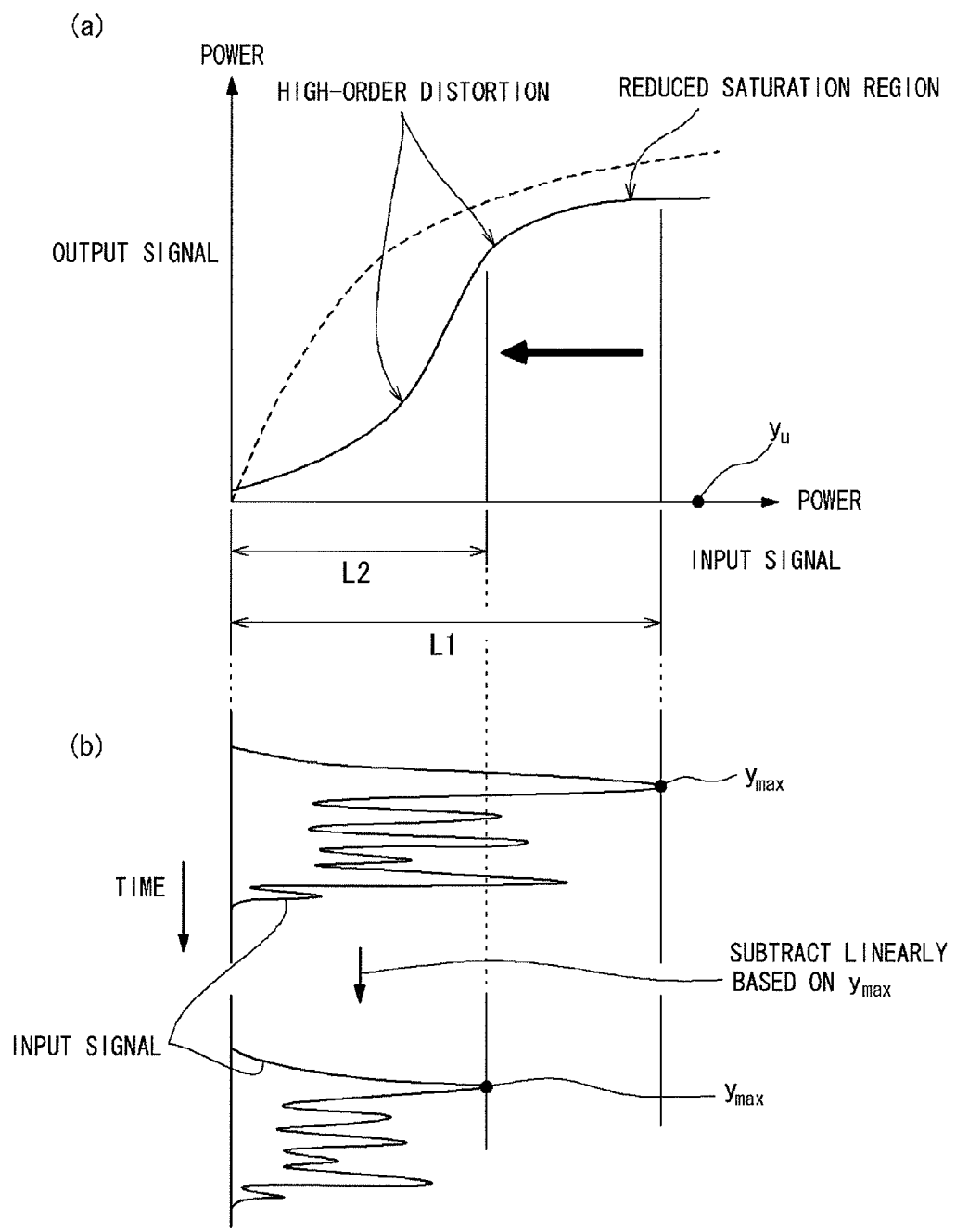
FIG. 5(a) is a schematic diagram showing input-output characteristics of an amplifier, in a normal state and in a state where a large distortion is appearing.
FIG. 5(b) is a diagram showing the input signal associated with the above input-output characteristics.

In FIG. 5, for example, when the saturation region has been lowered compared with the normal state, if the power of the input signal is decreased so as to narrow the range used in the amplifier 4 from L1 to L2, it is possible to avoid the use of the range where a large distortion appears due to the lowered saturation region. Also when a high-order distortion as in a large inflection portion has appeared, if the power value of the input signal is decreased to narrow the range used in the amplifier 4, the distortion level is relatively reduced and the influence of the high-degree distortion can be suppressed.

In this manner, by performing adjustment so as to decrease the power of the input signal thereby reducing the distortion level, it is possible to cause the distortion compensation by the predistorter 23 to be effectively acted. As a result, it is possible to suppress deterioration of the accuracy of the distortion compensation. Accordingly, it is possible to suppress the distortion that appears in the input-output characteristics of the amplifier 4.

In the present embodiment, the adjustment unit 26 determines whether the ACLR value detected by the ACLR calculation unit 25 is greater than the upper limit value $P_U$, and when determining that the ACLR value is greater than the upper limit value $P_U$, the adjustment unit 26 performs adjustment so as to decrease the power of the input signal. Accordingly, the distortion level in the input-output characteristics of the amplifier 4 can be reduced, and as a result, it is possible to suppress deterioration of the accuracy of the distortion compensation.

On the other hand, when the ACLR value is sufficiently smaller than the upper limit value $P_U$, it is possible to determine that there is room to further increase the power of the input signal while maintaining the accuracy of the distortion compensation.

Therefore, the adjustment unit 26 determines whether the ACLR value is smaller than the lower limit value $P_L$ which is set to a smaller value than the upper limit value $P_U$. When determining that the ACLR value is smaller than the lower limit value $P_L$, the adjustment unit 26 performs adjustment so as to increase the power of the input signal.

In this case, when determining that the ACLR value is sufficiently small after the ACLR value has been reduced by the power of the input signal having been decreased, the adjustment unit 26 performs adjustment so as to increase the power of the input signal. Therefore, for example, also when the distortion level in the input-output characteristics of the amplifier 4 was temporarily increased due to some cause and then reduced again, it is possible to prevent the power of the input signal from being maintained at the reduced level.

Moreover, in the present embodiment, when the distortion level becomes stable by decreasing the input signal power and the ACLR value is stably maintained between the upper limit value $P_U$ and the lower limit value $P_L$ for a predetermined time period, adjustment is performed so as to increase the input signal power (steps S113 to S115). Accordingly, it is possible to prevent the power of the input signal from being maintained at the reduced level.

In the above embodiment, when the power of the input signal is to be decreased, adjustment is performed within the range that allows the immediately-preceding model to be estimated. Accordingly, the distortion compensation can be accurately performed. On the other hand, when the power of the input signal is to be increased, the portion for which the power is increased is not included in the range of the immediately-preceding estimated model. Accordingly, the distortion compensation may not be accurately performed for the portion. Therefore, in the present embodiment, as described above, the amounts of change $\Delta y_3$ and $\Delta y_4$, which are used when the adjustment unit 26 increases the power of the input signal, are set to smaller values than the amounts of change $\Delta y_1$ and $\Delta y_2$, which are used when the adjustment unit 26 decreases the power of the input signal.

Accordingly, when the power of the input signal is to be increased, the power can be increased gradually by use of the amounts of change smaller than those used when the power is decreased. Therefore, it is possible to prevent the accuracy of the distortion compensation from being greatly deteriorated.

Moreover, for example, when the maximum power value of the input signal is relatively large and is located near the saturation region of the input-output characteristics of the amplifier, if the power of the input signal is greatly changed, the distortion level may be greatly changed, which may deteriorate the accuracy of the distortion compensation.

In this regard, in the present embodiment, the control unit 26b determines in step S103 (step S108) whether the maximum power value $y_{max}$ of the input signal is greater than the threshold value $y_{th}$. Based on the determination result, with respect to the amount of change for the power adjustment of the input signal, either the amount of change $\Delta y_1$ (the amount of change $\Delta y_3$) or the amount of change $\Delta y_2$ (amount of change $\Delta y_4$), which is greater than the amount of change $\Delta y_1$, is selected. Accordingly, when the maximum power value of the input signal is relatively large, which may cause a great change of the distortion level (when the maximum power value $y_{max}$ of the input signal is greater than the threshold value $y_{th}$), the amount of change for the power adjustment of the input signal can be set to a small value. Consequently, it is possible to suppress deterioration of the accuracy of the distortion compensation.

Figure 6:
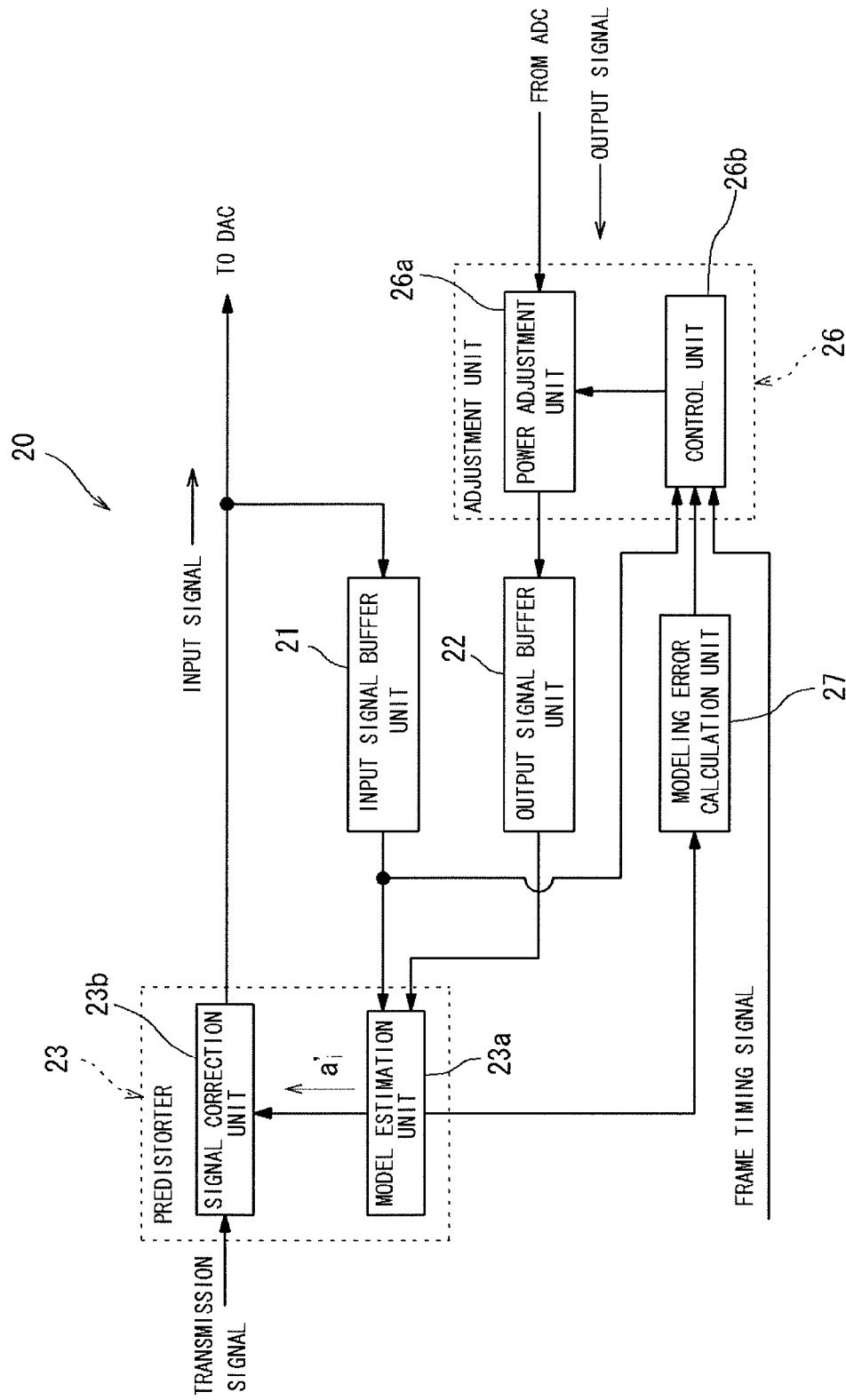
FIG. 6 is a functional block diagram of a digital predistortion circuit according to a second embodiment of the present invention.

FIG. 6 is a functional block diagram of a digital predistortion circuit according to a second embodiment of the present invention. The present embodiment is different from the first embodiment in that the present embodiment includes a modeling error calculation unit 27 instead of the ACLR calculation unit 25.

The modeling error calculation unit 27 determines an error between the estimated value determined by the inverse model estimated by the model estimation unit 23a and an actual signal power. If there is no great distortion of the input-output characteristics of the amplifier 4, no large error occurs in the inverse model estimated by the model estimation unit 23a. However, if there is a large distortion of the input-output characteristics of the amplifier 4, the error between the actual value and the estimated value in the estimation of the inverse model by the model estimation unit 23a tends to occur. This error tends to increase in accordance with the distortion level. Therefore, by numerically expressing the amount of the above error, it is possible to numerically express the distortion of the amplifier 4.

Hereinafter, description will be given of a method for determining the amount of modeling error of an inverse model, the method being performed by the modeling error calculation unit 27.

As described above, the model estimation unit 23a includes an amplifier model (inverse model) in which the input signal y is expressed by the power series polynomial of the output signal z. The inverse model is expressed as equation (3) below.

[Equation 3]

$$y = f(z) = \sum_i a'_i \cdot z^i \quad (3)$$

The model estimation unit 23a assigns the input signal and the output signal from the buffer units 21 and 22 into equation (3), performs operation, and determines the coefficient $a'_i$ for each order. Thereby, the model estimation unit 23a estimates a function representing the inverse model regarding the output signal z used for determining the input signal y.

Figure 7:
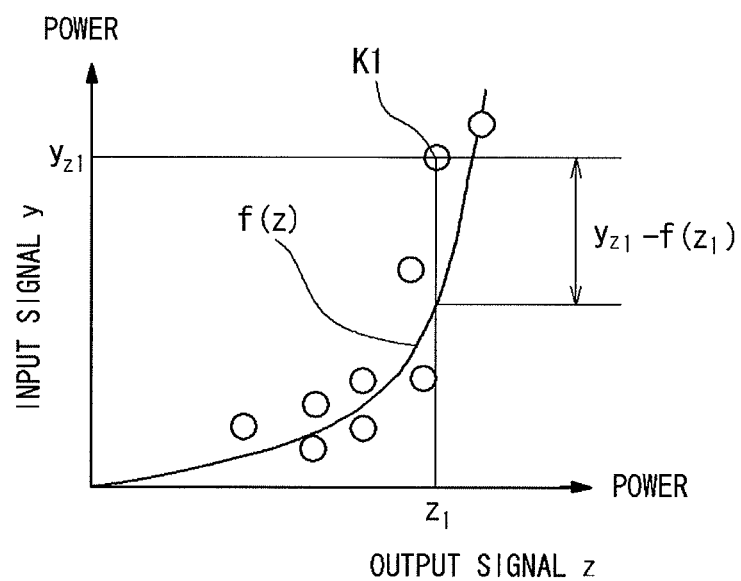
FIG. 7 is a graph showing the relationship between the input signal and the output signal accumulated in the buffer units, and is a view for explaining the relationship between the signals and an inverse model.

FIG. 7 is a graph showing the relationship between the input signal and the output signal accumulated in the buffer units 21 and 22, and is a view for explaining the relationship between the signals and an inverse model. In FIG. 7, the horizontal axis represents the output signal z and the vertical axis represents the input signal y. The inverse model is represented by the curve f(z).

Here, description will be given of the error of the inverse model function at an observation point K1, for example, which is determined by an input signal and an output signal that correspond to each other. It is assumed that, at the observation point K1, the power value of the output signal is z1 and the power value of the input signal is $y_{z1}$.

The amount of error between the power value of the actual input signal at the observation point K1 and the estimated input power value determined by the inverse model estimated by the model estimation unit 23a is expressed in FIG. 7 and by equation (4) below.

Amount of error at observation point $K1 = y_{z1} - f(z1)$ \quad (4)

The modeling error calculation unit 27 obtains from the model estimation unit 23a the estimated inverse model and input and output signals that are associated with each other for each observation point, and determines the amount of error for each observation point as shown in equation (5) below. Then, the modeling error calculation unit 27 determines, as an amount of modeling error, a value that is a ratio of the sum of squares of the amounts of errors to the sum of squares of actual input signals.

[Equation 4]

$$\text{Amount of modeling error} = \frac{\sum |y - f(z)|^2}{\sum |y|^2} \quad (5)$$

As described above, the modeling error calculation unit 27 forms a distortion level detection unit that numerically expresses the difference between the model (inverse model) representing the input-output characteristics of the amplifier 4 estimated by the model estimation unit 23a and the actual input-output characteristics of the amplifier 4 represented by the input signal and the output signal obtained from the signal buffer units 21 and 22, as the amount of modeling error, and that detects the amount of modeling error as the distortion level.

The adjustment unit 26 of the present embodiment has a function of adjusting the power of the input signal based on the amount of modeling error outputted by the modeling error calculation unit 27. The processing performed by the adjustment unit 26 is similar to that in the first embodiment. An upper limit value, a lower limit value, and the like for the amount of modeling error are set and the control unit 26b adjusts the power of the input signal based on these values.

According to the present embodiment, the modeling error calculation unit 27 is configured to detect the distortion level. Therefore, it is possible to know the error amount regarding the power of the input signal, the error amount being estimated by the estimated inverse model function, and the adjustment unit 26 can perform power adjustment of the input signal based on this error amount. As a result, it is possible to perform distortion compensation having a higher accuracy.

In each of the above embodiments, an example has been shown in which the adjustment unit 26 is provided between the output signal buffer unit 22 and the analog processing unit 3, to adjust the power of the output monitor signal, whereby the adjustment unit 26 indirectly adjusts the power of the input signal. However, the adjustment unit 26 may be provided on the upstream or downstream side of the signal correction unit 23b. In this case, the adjustment unit 26 can directly adjust the power of the input signal in accordance with the manner of power adjustment determined by the control unit 26b.

When the adjustment unit 26 is arranged on the upstream side of the output signal buffer unit 22 as in both embodiments above, the effect of the adjustment is reflected on the input signal via the model estimation unit 23a and the signal correction unit 23b, which is advantageous in that distortion compensation is performed. However, since the power of the input signal is indirectly adjusted by the power of the output monitor signal being adjusted, a slight time lag occurs before the effect of the adjustment is reflected on the input signal.

On the other hand, when the adjustment unit 26 is provided on the upstream or downstream side of the signal correction unit 23b, it is advantageous in that the power adjustment of the input signal is immediately reflected on the transmission signal.

The above embodiments are configured such that the power adjustment of the input signal is performed based on the maximum power value of the input signal. However, the configuration is not limited thereto. For example, adjustment may be performed based on the average power value or the like of the input signal.

Further, in the above embodiments, when the distortion level has abruptly changed to a great extent, in order to reduce the distortion level promptly, there arises a necessity to change the power of the input signal greatly in accordance with the change of the distortion level. Therefore, the adjustment unit 26 may be configured to adjust the amount of change for the power adjustment of the input signal, in accordance with the ACLR value and/or amount of modeling error which indicate the distortion level. Accordingly, even if the distortion level has abruptly changed to a great extent, it is possible to reduce the distortion level promptly.

In this case, as in the case where the control unit 26b adjusts the amount of change for the power adjustment of the input signal, in accordance with (the maximum power value of) the power of the input signal in step S103 (step S108), threshold values are set for the ACLR value and the amount of modeling error, and the control unit 26b is configured to adjust the amount of change in accordance with the threshold values.

Figure 8:
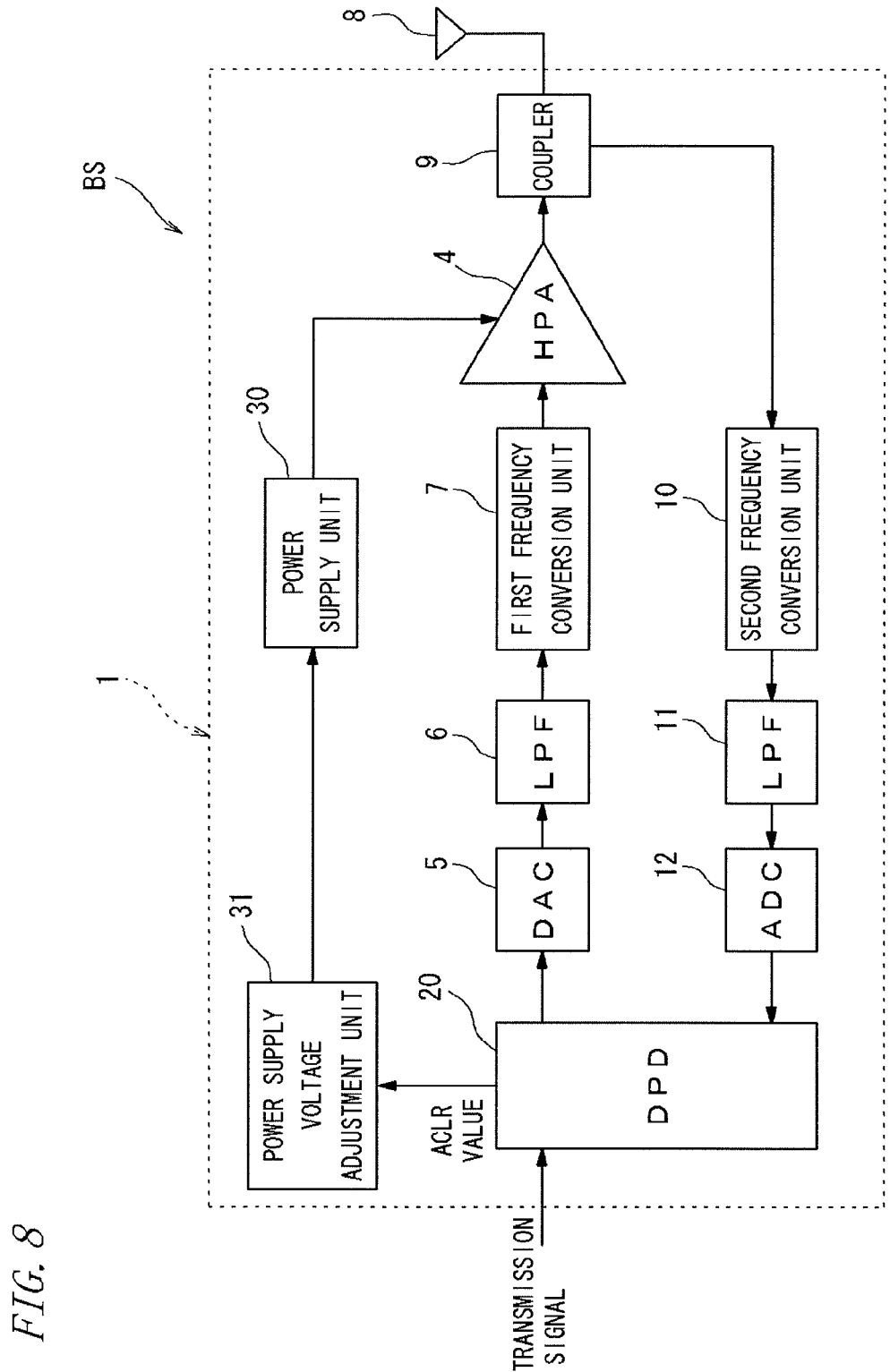
FIG. 8 is a block diagram showing an amplifying device of a base station device according to a third embodiment of the present invention.

FIG. 8 is a block diagram showing the amplifying device 1 of the base station device according to a third embodiment of the present invention. The present embodiment is different from the first embodiment in that the present embodiment further includes a power supply voltage adjustment unit 31 which adjusts the power supply voltage (drain voltage) to be provided to the amplifier 4 by a power supply unit 30 (not shown in FIG. 1).

Each of the first and the second embodiments has shown a case where deterioration of the accuracy of the distortion compensation is suppressed through adjustment of the power of the input signal, whereby the distortion occurring in the input-output characteristics of the amplifier 4 is suppressed. In contrast, the amplifying device 1 of the present embodiment can suppress distortion of the input-output characteristics of the amplifier 4 through power adjustment of the input signal, and in addition, can suppress distortion of the input-output characteristics of the amplifier 4 through adjustment of the power supply voltage. That is, the amplifying device 1 of the present embodiment is configured to use power adjustment of the input signal and adjustment of the power supply voltage in combination, thereby suppressing the distortion of the input-output characteristics of the amplifier 4.

The power supply voltage adjustment unit 31 is connected to the ACLR calculation unit 25 (FIG. 2) included in the digital predistortion circuit 20. Accordingly, the power supply voltage adjustment unit 31 is configured to obtain the ACLR value, which is the distortion level obtained by numerically expressing the distortion appearing in the input-output characteristics of the amplifier 4, and which is outputted by the ACLR calculation unit 25. The power supply voltage adjustment unit 31 has a function of adjusting the power supply voltage in accordance with the ACLR value outputted by the ACLR calculation unit 25, by controlling the power supply unit 30. The processing for the adjustment of the power supply voltage will be described below.

In the present embodiment, the control unit 26b of the adjustment unit 26 determines whether the ACLR value is greater than a predetermined threshold value $P_{th}$, and when the ACLR value is greater than the threshold value $P_{th}$, the control unit 26b performs the processing of adjustment of the power of the input signal shown in the flow chart in FIG. 4. The control unit 26b performs the above determination and waits for a predetermined time period while maintaining a state in which the processing for the adjustment of the power is being performed, or a state in which the processing for the adjustment is stopped. Then, the control unit 26b stops the processing for the adjustment and then performs the above determination again.

Figure 9:
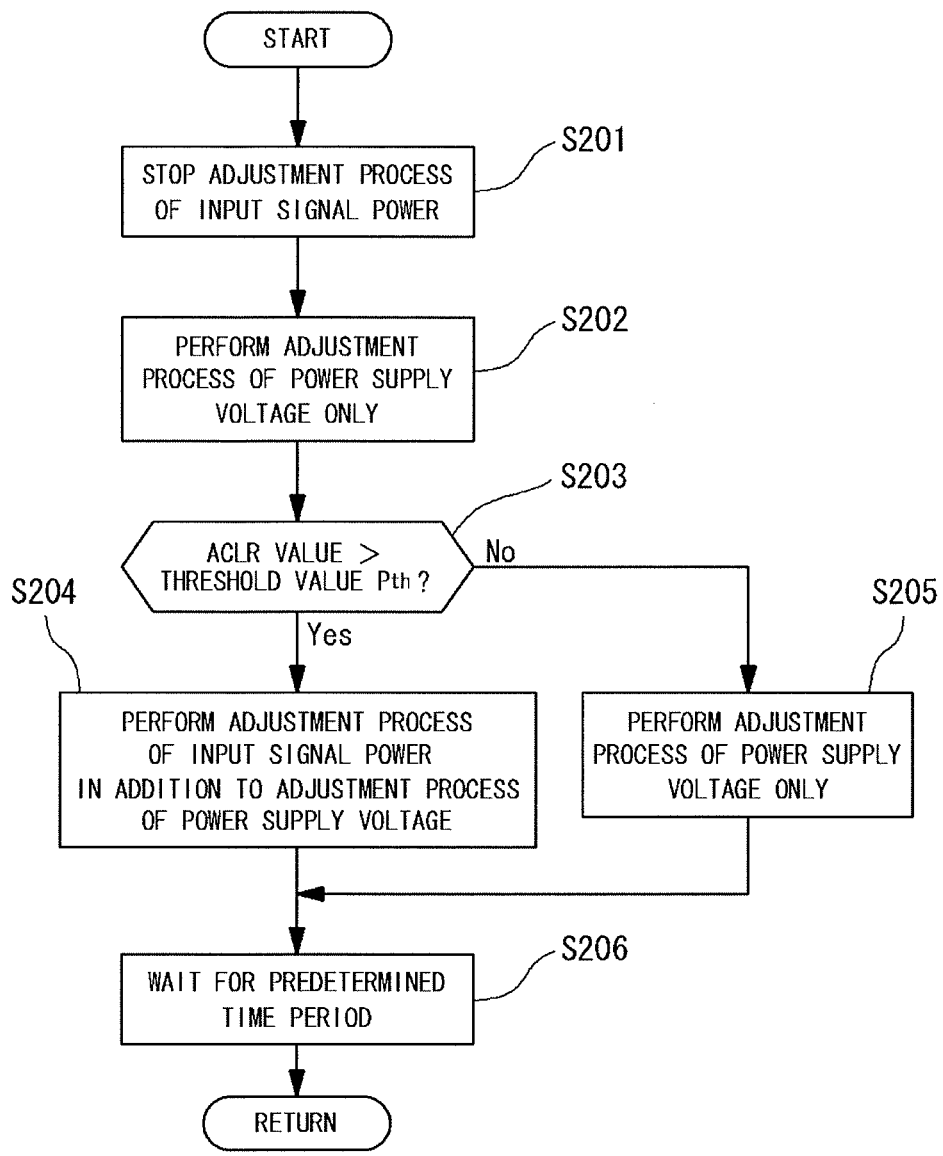
FIG. 9 is a flow chart showing processing at the time when adjustment of the power of the input signal and adjustment of a power supply voltage are performed in combination, the processing being realized by a control unit.

FIG. 9 is a flow chart showing the processing in which the power adjustment of the input signal and the adjustment of the power supply voltage are performed in combination, which is realized by the control unit 26b which operates as described above.

First, in step S201, the control unit 26b stops the processing for the power adjustment of the input signal and waits for a predetermined time period (step S201).

Here, the processing for the adjustment of the power supply voltage performed by the voltage adjustment unit 31 is always performed irrespective of the state where the processing for the power adjustment of the input signal is being performed or stopped.

Therefore, when the processing for the power adjustment of the input signal is stopped, only the processing for the power supply voltage adjustment is performed for the predetermined time period for which the control unit 26b waits (step S202). Note that the predetermined time period in step S201 for which the control unit 26b waits is set to a time period that is necessary for the processing for the adjustment of the power supply voltage to be performed only by the power supply voltage adjustment unit 31 and for the effect of the adjustment to be reflected on the input-output characteristics of the amplifier 4.

After having waited for the predetermined time period (step S201) after having stopped the processing for the power adjustment of the input signal, the control unit 26b determines whether the present ACLR value is greater than the threshold value $P_{th}$ which is used as a third threshold value (step S203).

Upon determining that the ACLR value is greater than the threshold value $P_{th}$ in step S203, the control unit 26b performs the processing for the power adjustment of the input signal. Therefore, in this case, in addition to the processing for the adjustment of the power supply voltage, the control unit 26b performs the processing for the power adjustment of the input signal (step S204). Then, the control unit 26b waits for a predetermined time period in the state where the processing for the power adjustment of the input signal is being performed (step S206), and then returns to the start.

On the other hand, upon determining that the ACLR value is not greater than the threshold value $P_{th}$, the control unit 26b maintains the state in which the processing for the power adjustment of the input signal is stopped. Therefore, in this case, the control unit 26b allows only the processing for the adjustment of the power supply voltage (step S205). Subsequently, the control unit 26b waits for the predetermined time period in the state where the processing for the power adjustment of the input signal is stopped (step S206), and then returns to the start. Note that the predetermined time period in step S206 for which the control unit 26b waits is set to a time period that is necessary for the processing for the adjustment of the power supply voltage by the power supply voltage adjustment unit 31 and the processing for the power adjustment of the input signal by the adjustment unit 26 to be performed, and for the effect of the adjustments to be reflected on the input-output characteristics of the amplifier 4.

Returning to step S201 after having waited for the predetermined time period, the control unit 26b stops the adjustment for the power adjustment of the input signal. Thus, only the processing for the power supply voltage adjustment is performed (step S202). Thereafter, the above described steps are repeated. Note that when restarting the processing for the power adjustment of the input signal after having stopped it, the control unit 26b starts the adjustment after resetting the power of the input signal to a predetermined signal power that serves as a reference.

Here, the threshold value $P_{th}$ is set to an upper limit value that is allowable as the level of distortion that occurs in the input-output characteristics of the amplifier 4, that is, for example, the same value as the upper limit value $P_U$ in the first embodiment.

That is, in the present embodiment, when the ACLR value as the distortion level cannot be suppressed to the threshold value $P_{th}$ or less only by the adjustment for the power supply voltage performed by the power supply voltage adjustment unit 31, the power adjustment of the input signal is performed, in addition to the adjustment of the power supply voltage, such that the distortion is further suppressed by the control unit 26b of the adjustment unit 26.

Accordingly, the power adjustment of the input signal performed by the adjustment unit 26 can complement the distortion suppression effect by the adjustment of the power supply voltage performed by the power supply voltage adjustment unit 31. Accordingly, it is possible to more effectively suppress the distortion that appears in the input-output characteristics of the amplifier 4.

Figure 10:
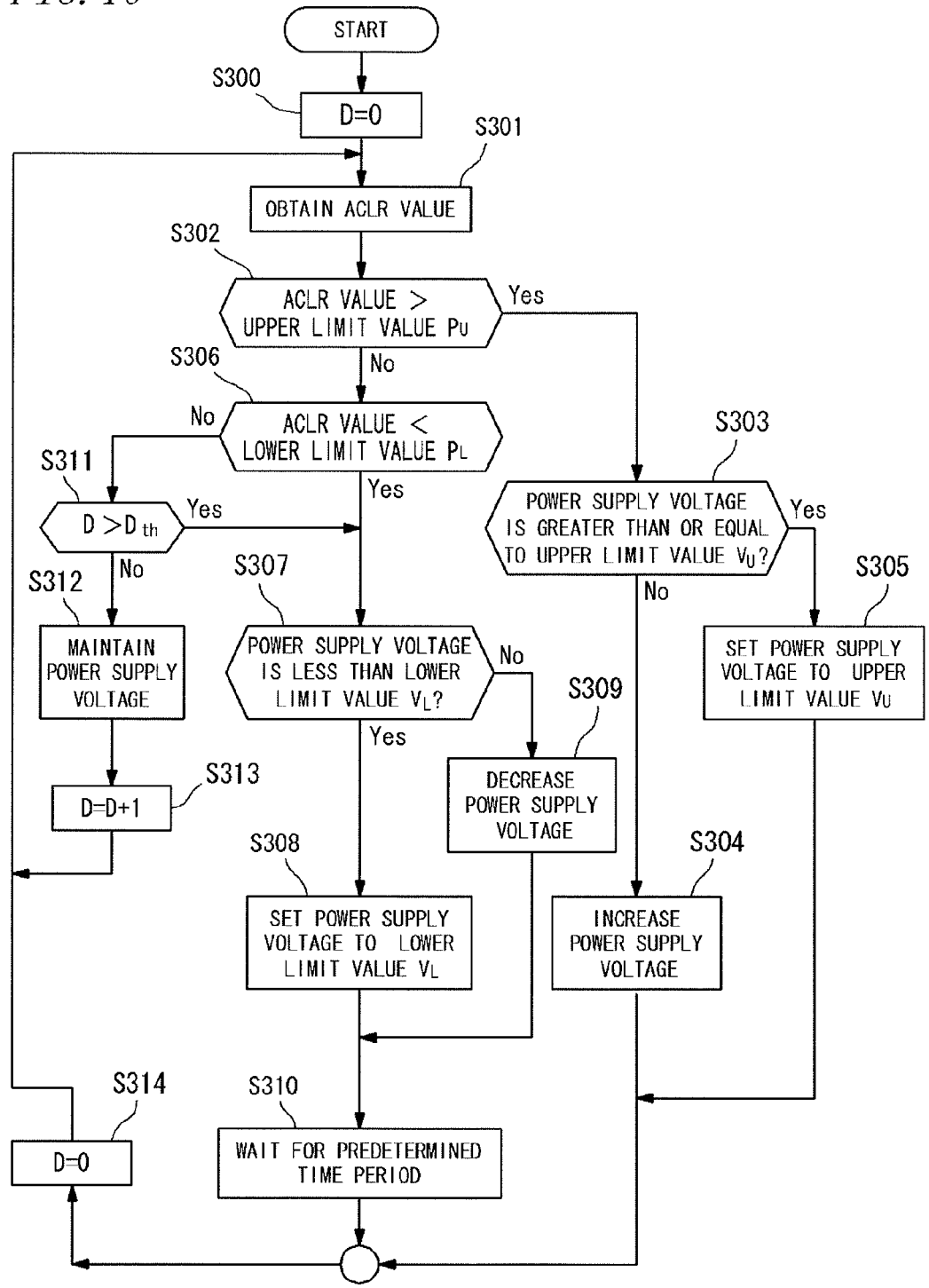
FIG. 10 is a flow chart showing processing of adjustment of the power supply voltage performed by a power supply voltage adjustment unit.

Next, description will be given of the processing for the adjustment of the power supply voltage performed by the power supply voltage adjustment unit 31. FIG. 10 is a flow chart showing the processing for the adjustment of the power supply voltage performed by the power supply voltage adjustment unit 31.

First, the power supply voltage adjustment unit 31 sets to "0" a counter value D of a counter that the power supply voltage adjustment unit 31 has as its own function (step S300). Then, the power supply voltage adjustment unit 31 obtains the ACLR value from the ACLR calculation unit 25 (step S301), and determines whether the ACLR value is greater than the upper limit value $P_U$ (fourth threshold value), described in the first embodiment, which is an upper limit value that is allowable as the level of distortion that appears in the input and output signals (step S302).

Upon determining that the ACLR value is greater than the upper limit value $P_U$ in step S302, the power supply voltage adjustment unit 31 determines whether the present power supply voltage is greater than or equal to an upper limit value $V_U$ (step S303). Upon determining that the present power supply voltage is greater than or equal to the upper limit value $V_U$, the power supply voltage adjustment unit 31 sets the power supply voltage to the upper limit value $V_U$ (step S305). Upon determining that the present power supply voltage is not greater than or equal to the upper limit value $V_U$, the power supply voltage adjustment unit 31 performs adjustment so as to increase the present power supply voltage by a predetermined amount of change (step S304).

As described above, when determining that the ACLR value is greater than the upper limit value $P_U$ in step S302, the power supply voltage adjustment unit 31 determines that the distortion level of the input-output characteristics of the amplifier 4 exceeds the tolerable range, and performs adjustment so as to increase the power supply voltage (step S304). Accordingly, when the distortion of the input-output characteristics of the amplifier 4 appears as a lowered saturation region, if the power supply voltage is increased, the saturation region can be raised relatively, and the adjustment can be performed in the direction in which the distortion in the power range of the input signal is suppressed.

Note that the upper limit value $V_U$ of the power supply voltage is set, for example, to a value between the rated voltage and the absolute maximum rated voltage of the amplifier 4.

After the process of step S304 or S305, the power supply voltage adjustment unit 31 sets the counter value D to "0" (step S314), and returns to step S301.

Meanwhile, when it is determined that the ACLR value is not greater than the upper limit value $P_U$ in step S302, the control unit 26b determines whether the ACLR value is smaller than a lower limit value $P_L$ (fifth threshold value) (step S306). The lower limit value $P_L$ is the same as the lower limit value $P_L$ in the first embodiment. The lower limit value $P_L$ is set to a value that is smaller than the upper limit value $P_U$ and that has a distortion level that is low enough to allow determination that there is room to decrease the power supply voltage (adjustable in the direction opposite to the direction in which the distortion is suppressed).

When it is determined that the ACLR value is smaller than the lower limit value $P_L$ in step S306, the power supply voltage adjustment unit 31 determines whether the present power supply voltage is less than a lower limit value $V_L$ (step S307). Upon determining that the present power supply voltage is less than the lower limit value $V_L$, the power supply voltage adjustment unit 31 sets the power supply voltage to the lower limit value $V_L$ (step S308). Upon determining that the present power supply voltage is not less than the lower limit value $V_L$, the power supply voltage adjustment unit 31 adjusts the present power supply voltage so as to decrease the power supply voltage by a predetermined amount of change (step S309).

Note that the lower limit value $V_L$ of the power supply voltage is set, for example, to the rated voltage of the amplifier 4.

As described above, when determining that the ACLR value is smaller than the lower limit value $P_L$ in step S306, and when determining that the present power supply voltage is not less than the lower limit value $V_L$ in step S307, the power supply voltage adjustment unit 31 determines that it is possible to decrease the power supply voltage, and performs adjustment so as to decrease the power supply voltage (step S309).

Note that the amount of change when the power supply voltage is decreased in step S309 is set to a value smaller than the amount of change used when the power supply voltage is increased in step S304.

After the process of step S308 or S309, the power supply voltage adjustment unit 31 waits for a predetermined time period (step S310), then sets the counter value D to "0" (step S314), and returns to step S301.

As described above, the power supply voltage adjustment unit 31 can provide a time interval for the timing at which the adjustment of the power supply voltage is performed, by waiting for a predetermined time period after performing adjustment of the power supply voltage. As a result, it is possible to suppress hunting from occurring when the processing for the adjustment of the power supply voltage is performed.

The timing from which the predetermined time period is waited for may be set to a timing either after the power supply voltage has been adjusted so as to be increased or after the power supply voltage has been adjusted so as to be decreased. However, it is preferable that the timing is set after the power supply voltage has been adjusted so as to be decreased, as in the present embodiment. The reason is as follows. As described below, the power supply voltage is to be decreased, the decrease may be performed gradually. However, when the power supply voltage is to be increased, the adjustment has to be performed immediately because distortion is currently occurring.

Returning to step S306, when it is determined that the ACLR value is not smaller than the lower limit value $P_L$ (step S306), the power supply voltage adjustment unit 31 determines whether the counter value D is greater than a predetermined threshold value $D_{th}$ (step S311).

Upon determining that the counter value D is greater than the threshold value $D_{th}$, the power supply voltage adjustment unit 31 advances to step S307, and performs adjustment so as to decrease the power supply voltage (steps S307 to S309).

On the other hand, upon determining that the counter value D is not greater than the threshold value $D_{th}$, the power supply voltage adjustment unit 31 maintains the power supply voltage (step S312).

Subsequently, the power supply voltage adjustment unit 31 adds "1" to the counter value D (step S313), and returns to step S301.

That is, in the state where the ACLR value is maintained between the upper limit value $P_U$ and the lower limit value $P_L$, the power supply voltage adjustment unit 31 performs adjustment to maintain the power supply voltage until the value of the counter value D becomes greater than the threshold value $D_{th}$ by being incremented every time the ACLR value is obtained. Then, when the counter value D has become greater than the threshold value $D_{th}$, the power supply voltage adjustment unit 31 performs adjustment so as to decrease the power supply voltage. That is, in the case where the state in which the ACLR value is maintained between the upper limit value $P_U$ and the lower limit value $P_L$ continues for a predetermined time period until the counter value D reaches the threshold value $D_{th}$, the power supply voltage adjustment unit 31 performs adjustment so as to decrease the power supply voltage.

Note that the threshold value $D_{th}$ is a value that determines the predetermined time period before it is determined that the power supply voltage is to be decreased, in accordance with the time interval at which the ACLR value is obtained. The threshold value $D_{th}$ is set to a value that can ensure a time period that allows determination that the ACLR value has become stable.

For example, when the distortion level has been temporarily increased due to some cause, the power supply voltage adjustment unit 31 attempts to decrease the distortion level by performing adjustment so as to increase the power supply voltage. However, there are some cases where the cause that has temporarily increased the distortion level is eliminated. In such a case, the distortion level is maintained at a low level, but the elimination of the cause that increased the distortion level creates room for decreasing the power supply voltage.

In the present embodiment, also in the above situation, when ACLR value is stably maintained between the upper limit value $P_U$ and the lower limit value $P_L$ for a predetermined time period, adjustment is performed so as to decrease the power supply voltage. Therefore, also when the distortion level has become stable after the power supply voltage was increased, adjustment is stared such that the power supply voltage is decreased. Accordingly, it is possible to perform adjustment so as to realize the power supply voltage as low as possible while suppressing the distortion level, and it is possible to prevent deterioration of efficiency of the amplifying device 1.

In this manner, the power supply voltage adjustment unit 31 repeats the processing in accordance with the flow chart shown in FIG. 10, thereby performing the processing for the adjustment of the power supply voltage by the power supply unit 30, in accordance with the ACLR value.

Since the amplifying device 1 configured as described above includes the power supply voltage adjustment unit 31 which adjusts the power supply voltage in accordance with the ACLR value indicating the distortion level detected by the ACLR calculation unit 25, even if a large distortion has occurred in the input-output characteristics of the amplifier 4 due to a temperature change or aged deterioration, it is possible to adjust the power supply voltage in the direction in which the distortion is suppressed in accordance with the distortion level. As a result, it is possible to suppress the distortion that appears in the input-output characteristics of the amplifier 4.

The power supply voltage adjustment unit 31 of the present embodiment determines whether the ACLR value is greater than the upper limit value $V_U$ which is allowable as a distortion level, and when determining that the ACLR value is greater than the upper limit value $V_U$, the power supply voltage adjustment unit 31 performs adjustment so as to increase the power supply voltage.

That is, when the ACLR value has become greater than the upper limit value, until the ACLR value becomes smaller than the upper limit value, adjustment is performed so as to increase the power supply voltage by a corresponding predetermined amount of change within the range between the upper limit value $V_U$ and the lower limit value $V_L$.

If the power supply voltage is adjusted so as to be increased, the saturation region of the amplifier 4 can be relatively raised. When the distortion of the input-output characteristics of the amplifier 4 is appearing as a lowered saturation region, adjustment is performed in the direction in which the distortion within the power range of the input signal is suppressed. Consequently, the distortion appearing in the input-output characteristics of the amplifier 4 can be suppressed.

On the other hand, when the ACLR value is sufficiently smaller than the upper limit value $P_U$, it is possible to determine that there is room for further decreasing the power supply voltage while suppressing the distortion.

Accordingly, the power supply voltage adjustment unit 31 determines whether the ACLR value is smaller than the lower limit value $P_L$, which is set to a value smaller than the upper limit value $P_U$, and when determining that the ACLR value is smaller than the lower limit value $P_L$, the power supply voltage adjustment unit 31 performs adjustment so as to decrease the power supply voltage.

In this case, when determining that the ACLR value is sufficiently small after the ACLR value has been reduced by the power supply voltage having been increased, the power supply voltage adjustment unit 31 performs adjustment so as to decrease the power supply voltage. Therefore, for example, also when the distortion level in the input-output characteristics of the amplifier 4 was temporarily increased due to some cause and then decreased again, it is possible to prevent the power supply voltage from being maintained at the increased level.

Moreover, in the present embodiment, when the distortion level has become stable by the power supply voltage having been increased and the ACLR value is stably maintained between the upper limit value $P_U$ and the lower limit value $P_L$ for a predetermined time period, adjustment is performed so as to decrease the power supply voltage (steps S311 to S313). Accordingly, it is possible to prevent the power supply voltage from being maintained at the increased level.

In the above embodiment, when the power supply voltage is to be increased, there is little possibility of deterioration of the input-output characteristics of the amplifier 4. However, when the power supply voltage is to be decreased, the saturation region may be lowered, and distortion may occur in the input-output characteristics of the amplifier 4. Therefore, in the present embodiment, as described above, the amount of change used when the power supply voltage adjustment unit 31 decreases the power supply voltage is set to a value smaller than the amount of change used when the power supply voltage adjustment unit 31 increases the power supply voltage.

Accordingly, when the power supply voltage is to be decreased, it is possible to decrease the power supply voltage gradually by an amount of change smaller than that used when the power supply voltage is increased. Therefore, it is possible to suppress a large distortion from occurring in the input-output characteristics of the amplifier 4 due to the adjustment.

Moreover, in the present embodiment, when the distortion level has abruptly changed to a great extent, in order to reduce the distortion level promptly, there arises a necessity to change the power supply voltage to a great extent in accordance with the change of the distortion level. Thus, the power supply voltage adjustment unit 31 may be configured to adjust the amount of change for the adjustment of the power supply voltage, in accordance with the ACLR value indicating the distortion level. For example, if the amount of change used when the power supply voltage is increased is set to a larger value in accordance with an increase in the ACLR value, even if the distortion level has abruptly changed to a great extent, it is possible to reduce the distortion level promptly.

The present embodiment has shown an example in which the digital predistortion circuit 20 described in the first embodiment and the power supply voltage adjustment unit 31 are included, and the power supply voltage adjustment unit 31 adjusts the power supply voltage using the distortion level detected by the ACLR calculation unit 25. In contrast, the digital predistortion circuit 20 described in the second embodiment and the power supply voltage adjustment unit 31 may be provided, and the power supply voltage adjustment unit 31 may adjust the power supply voltage using the amount of modeling error outputted by the modeling error calculation unit 27 as the distortion level.

In the present embodiment, as described above, for example, when the processing for the adjustment of the power supply voltage by the power supply voltage adjustment unit 31 cannot suppress the ACLR value to the threshold value $P_{th}$ or less, the adjustment unit 26 performs the processing for the power adjustment of the input signal, in addition to the processing for the adjustment of the power supply voltage performed by the power supply voltage adjustment unit 31.

Thus, the power adjustment of the input signal performed by the adjustment unit 26 can complement the distortion suppression effect by the adjustment of the power supply voltage performed by the power supply voltage adjustment unit 31. Accordingly, it is possible to more effectively suppress the distortion that appears in the input-output characteristics of the amplifier 4.

The present embodiment is configured such that the power supply voltage adjustment unit 31 adjusts the power supply voltage supplied by the power supply unit 30. Alternatively, for example, as shown in FIG. 11, instead of the power supply unit 30, a power supply modulation unit 40 may be provided which has an envelope tracking function that applies to the amplifier 4 a power supply voltage modulated in accordance with an envelope signal of the input signal, and the power supply voltage adjustment unit 31 may adjust the power supply voltage of the power supply modulation unit 40.

Figure 11:
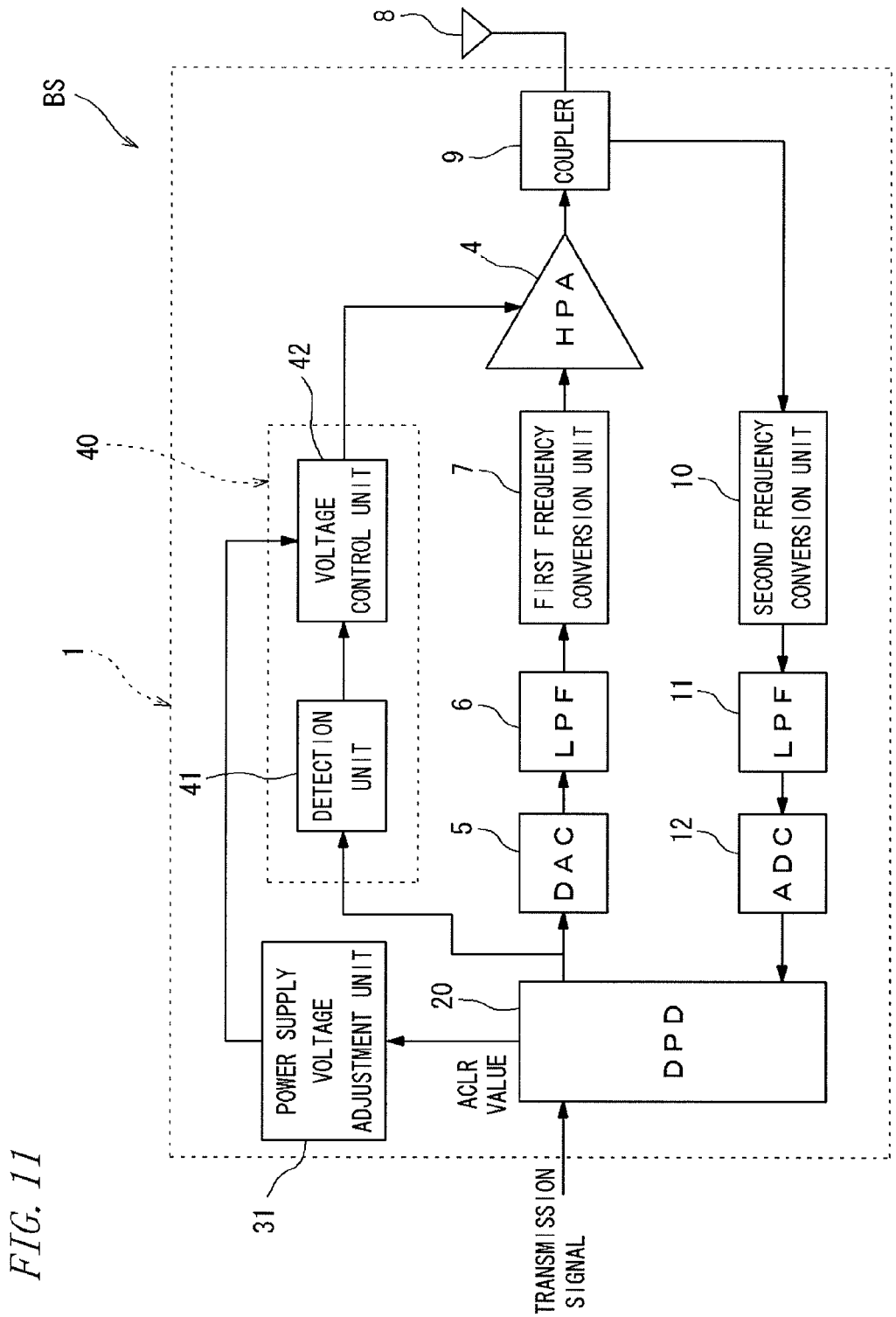
FIG. 11 is a block diagram showing another example of the amplifying device shown in FIG. 8.

In FIG. 11, the power supply modulation unit 40 includes a detection unit 41 which detects the input signal to obtain an envelope signal, and a voltage control unit 42 which performs power-voltage conversion and D/A conversion on the obtained envelope signal and provides a resultant power supply voltage to the amplifier 4.

The voltage control unit 42 modulates the power supply voltage in accordance with the envelope signal within a predetermined voltage range and provides the resultant power supply voltage to the amplifier 4. The voltage control unit 42 controls the power supply voltage by so-called envelope tracking system, in which the power supply voltage is suppressed when the power of the envelope signal is relatively low, and the power supply voltage is increased when the power of the envelope signal is relatively high, in accordance with the power, thereby increasing the power efficiency.

Here, as a function of adjusting the power supply voltage, the power supply voltage adjustment unit 31 in FIG. 11 has a function of adjusting the maximum value in a predetermined voltage range used when the voltage control unit 42 controls the power supply voltage.

The power supply voltage adjustment unit 31 adjusts the maximum value in accordance with the ACLR value from the ACLR calculation unit 25. The maximum value can be determined based on the flow chart shown in FIG. 10 as in the above embodiments.

Note that the present invention is not limited to the above embodiments.

For example, the first and second embodiments has each described a case where only the power of the input signal is adjusted by the adjustment unit 26, and the third embodiment has described a case where the power supply voltage adjustment unit 31 is further provided in addition to the adjustment unit 26 and the power of the input signal and the power supply voltage (drain voltage) to be applied to the amplifier 4 are adjusted. However, the power supply voltage adjustment unit 31 may be provided without provision of the adjustment unit 26, and only the power supply voltage may be adjusted, thereby the distortion occurring in the input-output characteristics of the amplifier 4 may be suppressed.

In the above embodiments, an example case has been shown in which one of the ACLR value and the amount of modeling error is used as the distortion level and the input signal power is adjusted based on the value. However, for example, both of the ACLR calculation unit 25 and the modeling error calculation unit 27 may be provided, and the input signal power (power supply voltage) may be adjusted based on both of the ACLR value and the amount of modeling error. In this case, the control unit 26b performs adjustment so as to decrease the input signal (increase the power supply voltage) (steps S104 and S105 in FIG. 4, and step S304 in FIG. 10) when one of the ACLR value and the amount of modeling error is greater than the upper limit value (step S102 in FIG. 4 and step S302 in FIG. 10). When both are less than or equal to the upper limit value (step S102 in FIG. 4), adjustment is performed so as to maintain or increase the power of the input signal (maintain or decrease the power supply voltage) (steps S109, S110, and S114 in FIG. 4, and steps S309 and S312 in FIG. 10).

Further, also with respect to the lower limit value, when either one of them is smaller than the lower limit value (step S106, and step S306 in FIG. 10), adjustment is performed so as to increase the input signal (decrease the power supply voltage) (steps S109 and S110 in FIG. 4, and step S309 in FIG. 10). When both are greater than or equal to the lower limit value, adjustment is performed so as to maintain the power of the input signal (step S114 in FIG. 4, and step S312 in FIG. 10). According to the above configuration, it is possible to detect the distortion level of the amplifier more multilaterally.

Note that the embodiments disclosed in the present invention are to be considered in all respects as illustrative and not restrictive. The scope of the invention is not limited to the foregoing meaning, and all changes which come within the meaning and range of equivalency of the claims are therefore intended to be embraced therein.

DESCRIPTION OF THE REFERENCE CHARACTERS

| | |
|---|---|
| 1 | amplifying device |
| 4 | amplifier |
| 20 | digital predistortion circuit |
| 23 | predistorter |
| 25 | ACLR calculation unit (distortion level detection unit) |
| 26 | adjustment unit (signal power adjustment unit) |
| 27 | modeling error calculation unit (distortion level detection unit) |
| 30 | power supply unit |
| 31 | power supply voltage adjustment unit |
| 40 | power supply modulation unit |
| BS | base station device |

The invention claimed is:

1. An amplifying device comprising:
an amplifier that amplifies a power of an input signal;
a predistorter that obtains the input signal and an output signal outputted by the amplifier in response to the input signal and that performs distortion compensation of the amplifier;
a distortion level detection unit that detects a distortion level of distortion that appears in input-output characteristics of the amplifier for which characteristics the distortion compensation has been performed; and
an adjustment unit that adjusts the power of the input signal in accordance with the distortion level, wherein
the adjustment unit indirectly adjusts the power of the input signal by adjusting the power of the output signal to be obtained by the predistorter.

2. The amplifying device according to claim 1, wherein
the adjustment unit determines whether the distortion level detected by the distortion level detection unit is greater than a first threshold value predetermined as an upper limit value that is allowable as the distortion level, and when determining that the distortion level is greater than the first threshold value, the adjustment unit performs the adjustment so as to decrease the power of the input signal.

3. The amplifying device according to claim 2, wherein
the adjustment unit determines whether the distortion level is lower than a second threshold value which is set to a value smaller than the first threshold value, and when determining that the distortion level is lower than the second threshold value, the adjustment unit performs the adjustment so as to increase the power of the input signal.

4. The amplifying device according to claim 3, wherein
an amount of change used when the adjustment unit increases the power of the input signal is set to a value smaller than an amount of change used when the adjustment unit decreases the power of the input signal.

5. The amplifying device according claim 1, wherein
after adjusting the power of the input signal, the adjustment unit waits for a predetermined time period to elapse, before adjusting the power of the input signal again.

6. The amplifying device according claim 1, wherein
the adjustment unit adjusts the amount of change for the power adjustment of the input signal, in accordance with the power of the input signal.

7. The amplifying device according to claim 6, wherein
the adjustment unit performs the adjustment in accordance with a maximum power value of the input signal.

8. The amplifying device according to claim 1, wherein
the adjustment unit adjusts the amount of change for the power adjustment of the input signal, in accordance with the distortion level.

9. The amplifying device according to claim 1, wherein
the distortion level detection unit obtains an output signal from the amplifier, determines a leakage power ratio of a power of an adjacent frequency band adjacent to an available frequency band, which is available for the output signal, to a power of the available frequency band, and outputs the leakage power ratio as the distortion level.

10. An amplifying device comprising:
an amplifier that amplifies a power of an input signal;
a predistorter that obtains the input signal and an output signal outputted by the amplifier in response to the input signal and that performs distortion compensation of the amplifier;

a distortion level detection unit that detects a distortion level of distortion that appears in input-output characteristics of the amplifier for which characteristics the distortion compensation has been performed; and an adjustment unit that adjusts the power of the input signal in accordance with the distortion level wherein the predistorter estimates a model representing the input-output characteristics of the amplifier by using the input signal and the output signal, and performs the distortion compensation of the amplifier by using the model, and the distortion level detection unit determines, as an amount of modeling error, a difference between the model estimated by the predistorter and the input-output characteristics of the amplifier expressed based on the input signal and the output signal, and outputs the amount of modeling error as the distortion level.

11. The amplifying device according to claim 1, wherein the adjustment unit directly adjusts the power of the input signal.

12. A wireless transmission device including an amplifying device, wherein the amplifying device is the amplifying device according to claim 1.

* * * * *